US006498055B2

(12) United States Patent
Fukuda et al.

(10) Patent No.: US 6,498,055 B2
(45) Date of Patent: Dec. 24, 2002

(54) SEMICONDUCTOR DEVICE, METHOD OF MANUFACTURING SEMICONDUCTOR DEVICE, RESIN MOLDING DIE, AND SEMICONDUCTOR MANUFACTURING SYSTEM

(75) Inventors: Masatoshi Fukuda, Kanagawa-ken (JP); Susumu Harada, Kanagawa-ken (JP); Tetsuya Sato, Mie-ken (JP); Hidenobu Sato, Kanagawa-ken (JP); Atsushi Nakano, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/855,529

(22) Filed: May 16, 2001

(65) Prior Publication Data

US 2001/0042913 A1 Nov. 22, 2001

(30) Foreign Application Priority Data

May 17, 2000 (JP) ....................................... 2000-145453

(51) Int. Cl.[7] ......................... H01L 21/44; H01L 21/48; H01L 21/80

(52) U.S. Cl. ........................ 438/127; 257/687; 257/697

(58) Field of Search ................................ 257/687, 697; 438/127; 264/272.17

(56) References Cited

U.S. PATENT DOCUMENTS 6,080,354 A * 6/2000 Miyajima .................. 264/511

FOREIGN PATENT DOCUMENTS

| | | | |
|---|---|---|---|
| EP | 0 573 232 | * | 8/1993 |
| JP | 07-221132 | | 8/1995 |
| JP | 7-283257 | * | 10/1995 |
| JP | 10-050746 | | 2/1998 |
| JP | 10-119082 | * | 5/1998 |
| JP | 11-195659 | | 7/1999 |

* cited by examiner

*Primary Examiner*—David Nelms
*Assistant Examiner*—Tu-Tu Ho
(74) *Attorney, Agent, or Firm*—Finnegan, Henderson, Farabow, Garrett & Dunner, L.L.P.

(57) ABSTRACT

In a semiconductor device manufacturing method, at least a semiconductor element is arranged in a cavity of a resin molding die. A resin is supplied to a resin reservoir in direct contact with the cavity and is then injected in order to substantially fill the cavity. The resin filled in the cavity forms a resin seal for encapsulating the semiconductor element. The resin seal has a recess or a protrusion as a remainder of the resin reservoir.

22 Claims, 20 Drawing Sheets

50

55 521 550 52 54 511 51 510 512 520 53 58 58

RELATED ART

RELATED ART

RELATED ART

RELATED ART

RELATED ART

RELATED ART

SEMICONDUCTOR DEVICE, METHOD OF MANUFACTURING SEMICONDUCTOR DEVICE, RESIN MOLDING DIE, AND SEMICONDUCTOR MANUFACTURING SYSTEM

CROSS-REFERENCE TO RELATED APPLICATION

This application claims benefit of priority under 35 U.S.C. § 119 to Japanese Patent Application No. 2000-145453, filed on May 17, 2000, the entire contents of which is incorporated by reference herein.

DETAILED DESCRIPTION OF THE INVENTION

1. Field of the Invention

This invention relates to a semiconductor device, a method of manufacturing a semiconductor device, a resin molding die, and a semiconductor manufacturing system, and more particularly relates to a semiconductor device in which at least one semiconductor element (e.g. a semiconductor chip) is encapsulated in a resin seal, a method of manufacturing such a semiconductor device, a resin molding die used in the methods, and a semiconductor manufacturing system for carrying out the foregoing semiconductor device manufacturing method.

2. Description of Related Art

Semiconductor devices having the ball grid array structure are well-known at present. Referring to FIG. 25 and FIG. 26 of the accompanying drawings, such a semiconductor device comprises: a substrate 1 made of a resin, a tape, ceramics or the like and having a wiring circuit formed thereon; a semiconductor chip 2 fixedly mounted on the substrate 1 using an adhesive layer 3; a bonding wire 5, e.g. a gold bonding wire, connecting a bonding pad of the semiconductor chip 2 and a wiring circuit terminal 4 on the substrate 1; and a resin seal 6 for encapsulating the semiconductor chip 2. A resin gate scar 6G via which resin was injected for the transfer molding process remains on a side surface of the resin seal 6. External connection terminals 8 constituted by solder balls are electrically connected to the wiring circuit terminal 4 on the rear surface of the substrate 1.

FIG. 27 and FIG. 28 show a cavity-down type semiconductor device having the ball grid array structure. The semiconductor device comprises: a substrate 1 made of a resin, a tape, ceramics or the like and having a wiring circuit and a through-hole on the center thereof; a metal plate 10 or an insulated plate 10 stuck onto the substrate 1 by an adhesive layer 9; a semiconductor chip 2 fixedly attached by an adhesive layer 3 in a recess defined by the through-hole in the substrate 1 and the plate 10; a bonding wire 5, e.g. a gold bonding wire, connecting a bonding pad of the semiconductor chip 2 to a wiring circuit terminal 4 on the rear surface of the substrate 1; and a resin seal 6 encapsulating the semiconductor chip 2. A resin gate scar 6G via which resin was injected for the transfer molding process remains on a side surface of the resin seal 6. External connection terminals 8 constituted by solder balls are electrically connected to the wiring circuit terminal 4 on the rear surface of the substrate 1, i.e. where the wiring circuit terminal 4 is provided.

The semiconductor device of FIG. 25 and FIG. 26 is resin molded as shown in FIG. 29A and FIG. 29B. A resin molding die including upper and lower dies 11 and 12 is heated to a temperature of approximately 165° C. to 185° C. Thereafter, a resin tablet or powder 14 is supplied to a pot 13 in the lower die 12. The substrate 1, on which the semiconductor chip 2 and the bonding pad of the semiconductor chip 2 are provided and is connected to the wiring circuit terminal 4 using the gold bonding wire 5, is placed between the upper and lower dies 11 and 12. In this state, the upper and lower dies 11 and 12 are clamped as shown in FIG. 29A. The resin 14 in the pot 13 is pressurized using a plunger 15 and melted, and is injected into a cavity 17 via a runner 16 and the resin gate 7. The resin 14 is left as it is for approximately 40 seconds to 180 seconds, and is hardened in order to form the resin seal 6. Thereafter, the upper and lower dies 11 and 12 are unclamped, so that the resin seal 6 is removed from the upper and lower dies 11 and 12. By this, the semiconductor device is almost completed. The resin seal 6 includes superfluous resins 14A such as a cull 18, runner 17 and resin gate 7 formed when injecting the resin 14, which are removed by the gate-breaking, and are discharged.

In order to facilitate the peeling of the unnecessary resin 14A in the gate-breaking, a metal part 19 is sometimes provided over the runner 16 and resin gate 7 on the substrate 1, as shown in FIG. 30.

In the semiconductor device of FIG. 27 and FIG. 28, the resin seal 6 is at the center of the rear surface of the substrate 1, and is surrounded by the external connection terminals 8. Therefore, if the runner 16 extends over a part of the external connection terminals 8 (solder balls), a part of the surplus resin 14A may stick on them. Some surplus resin 14A may scrape a part of external connection terminals 8 which are being formed. Any of resin molding processes shown in FIG. 31 to FIG. 34 is utilized in order to overcome this problem.

In a first resin molding process shown in FIG. 31, a resin is injected with a third die or a plate 20 inserted between upper and lower dies 11 and 12. Specifically, the third die or plate 20 extends all over the external connection terminals 8 on the rear surface of the substrate 1, so that the resin cannot stick onto the external connection terminals 8.

According to a second resin molding process shown in FIG. 32, the resin is injected with a sheet 21 such as a film sandwiched between the upper and lower dies 11 and 12. Similarly to the third die or plate 20, the sheet 21 extends all over the external connection terminals 8 on the rear surface of the substrate 1, which can prevent the resin from sticking onto the external connection terminals 8.

A third resin molding process shown in FIG. 33 is described in Japanese Patent Laid-Open Publication No. Hei 7-221132, for example. In this method, a resin inlet 22 is in the shape of a recess and extends between the pot 13 in the lower die 12 and the plate 10 connecting to the pot 13. Further, a resin outlet 23 extends to the cavity 17 from the resin inlet 22. The resin 14 in the pot 13 is pushed upward using a plunger 15 in order to fill the cavity 17 via the resin inlet 22 and the resin outlet 23. Both the resin inlet 22 and the resin outlet 23 are formed in the substrate 1. Since no resin 14 passes over the external connection terminals 8, it is possible to prevent the resin 14 from sticking onto the external connection terminals 8.

A fourth resin molding process is similar to the third method. However, the fourth method is applied to a cavity-up type semiconductor device as shown in FIG. 34. This semiconductor device comprises: a substrate 1 made of a resin, a tape, ceramics or the like and having a wiring circuit provided thereon; a frame 24 made of a metal plate or an insulated plate, having a through-hole at the center thereof and stuck onto the front surface of the substrate 1 using an adhesive layer 25; a semiconductor chip 2 fixedly attached using an adhesive layer 3 in a recess defined by the substrate 1 and the through-hole in the frame 24; a bonding wire 5, e.g. a gold bonding wire, connecting a bonding pad of the semiconductor chip 2 to a wiring circuit terminal 4 on the front surface of the substrate 1; and a resin seal (not shown) encapsulating the semiconductor chip 2. In this method, a resin inlet 22 in the shape of a recess is formed in the frame 24 and around the semiconductor chip 2 and is connected to the pot 13 provided in the lower die 12. Further, a resin outlet 23 extends from the resin inlet 22 to the cavity 17. The resin 14 in the pot 13 is pushed upward by the plunger 15, and injected into the cavity 17 via the resin inlet 22 and the resin outlet 23. Both the resin inlet 22 and the resin outlet 23 are formed in the substrate 1, so that no resin 14 passes over the external connection terminals 8. This is effective in preventing the resin 14 from sticking onto the external connection terminals 8.

However, the foregoing semiconductor device and the foregoing manufacturing methods seem to suffer from the following problems.

(1) In the resin molding process shown in FIG. 29A and FIG. 29B for the semiconductor device of FIG. 25 and FIG. 26, there are formed not only the resin seal 6 but also the unnecessary resin 14A such as the cull 18 of the molding die, runner 16 and resin gate 17. The unnecessary resin 14A is removed from the rein seal 6 after the gate-breaking, and is discharged as waste. As a result, most of the resin 14 housed in the pot 13 would be wasted, which not only increases the manufacturing cost of the semiconductor devices but also is not desirable in view of effective use of resources.

(2) During the gate-breaking, the resin seal 6 may peel off from the substrate 1, or may crack, which would adversely affect the reliability of the semiconductor device and reduce the manufacturing yield of the semiconductor device.

(3) In the semiconductor device shown in FIG. 30, no wiring circuit for the wiring circuit terminals 4, external connection terminals 8 and so on can be arranged in the area where the metal part 19 is provided in order to facilitate the gate-breaking, so that the substrate 1 becomes large due to the metal part 19, which makes it difficult to downsize the semiconductor device.

(4) With the resin molding process shown in FIG. 29A and FIG. 29B, if the substrate 1 whose thickness is larger than the predetermined value because of dispersion of manufacturing quality is placed in the molding die, there may be a gap between the upper and lower dies 11 and 12 near the pot 13 and the runner 16. Conversely, if the substrate 1 is thinner than the predetermined value, a gap is caused between the upper die 11 and the substrate 1. If the substrate 1 is too thick, the resin 14 tends to leak via the gap when it is being injected. Especially, a substrate 1 made of sintered ceramics and having a reduced dimensional tolerance has low elasticity and is slow to be deformed during the die clamping. This means that the resin frequently leaks if the substrate 1 has a thickness deviating from the predetermined value. Further, the thicker the ceramics substrate, the more easily it cracks.

(5) The first resin molding process shown in FIG. 31 for the semiconductor device of FIG. 27 and FIG. 28 requires the provision of the additional die or plate 20 between the upper and lower dies 11 and 12. Further, the second resin molding process of FIG. 32 needs the sheet 21 to be provided. It is extremely difficult to automatically attach the additional die or plate 20, or the sheet 21 to a general purpose transfer molding system. For this purpose, a new dedicated device has to be provided. In addition, the additional die or plate 20, or the sheet 21 has to be prepared, which would adversely increase the manufacturing cost and product cost of the semiconductor device.

(6) In the third and fourth resin molding processes shown in FIG. 33 and FIG. 34, both the substrate 1 and the frame 24 are thickened in order to form the resin inlet 22 and the resin outlet 23. Further, no external connection terminals 8 can be provided on the area for the resin inlet 22, so that not only the substrate 1 but also the frame 24 have to become large. Therefore, it is very difficult to downsize the semiconductor device. Still further, since the resin inlet 22 and the resin outlet 23 are provided in the substrate 1 or the frame 24, the mechanical strength of the substrate 1 where the rein inlet 22 and the resin outlet 23 are positioned is reduced, which requires the substrate 1 or the frame 24 to be enlarged in order to secure sufficient mechanical strength. In short, it is extremely difficult to downsize the semiconductor device. In addition, the resin inlet 22 and the resin outlet 23 should be machined by special processes, which adversely increases the manufacturing cost and product cost of the semiconductor device, and reduces the manufacturing yield of the semiconductor device.

SUMMARY OF THE INVENTION

This invention has been devised in order to overcome the foregoing problems of the related art. A first object of the embodiment of the invention is to provide a method of manufacturing a semiconductor device which is free from resin waste generated during the formation of a resin seal, and is less expensive.

A second object of the embodiment of the invention is to provide a method of manufacturing a reliable semiconductor device which is protected against the peeling of a resin seal and shorting of wires, and improves manufacturing yield.

It is a third object of the embodiment of the invention to provide a resin molding die which is effective in carrying out the foregoing semiconductor device manufacturing method.

A fourth object of the embodiment of the invention is to provide a semiconductor manufacturing system to which the foregoing semiconductor device manufacturing method is applicable.

A final object of the embodiment of the invention is to provide a reliable semiconductor device.

According to a first aspect of the invention, there is provided a method of manufacturing a semiconductor device comprising: (1) arranging at least one semiconductor element in a cavity of a resin molding die; (2) supplying a resin to a resin reservoir in direct contact with the cavity in order to substantially fill the cavity; and (3) injecting the resin into the cavity from the resin reservoir in order to form a resin seal for encapsulating the semiconductor element.

In accordance with a second aspect of the invention, there is provided a method of manufacturing a semiconductor device comprising: (1) arranging at least a base and a semiconductor element on the base in a cavity of a resin molding die; (2) supplying a resin to a resin reservoir in direct contact with the cavity and above the semiconductor element in order to substantially fill the cavity; and (3) injecting the resin into the cavity from the resin reservoir in order to form a resin seal for encapsulating at least a part of the base and the semiconductor element.

With a third aspect of the invention, there is provided a method of manufacturing a semiconductor device comprising: (1) arranging at least a base and a semiconductor element on the base in a cavity of a resin molding die; (2) supplying a resin to a resin reservoir at the center of the cavity facing with an upper surface of the semiconductor element in order to substantially fill the cavity; and (3) injecting the resin into the cavity from the resin reservoir in order to form a resin seal for encapsulating at least a part of the base and the semiconductor element.

According to a fourth aspect of the invention, there is provided a resin molding die comprising: a cavity; a resin reservoir in direct contact with the cavity and housing a resin for substantially filling the cavity; and a pusher injecting the resin into the cavity from the resin reservoir.

In accordance with a fifth aspect of the invention, there is provided a semiconductor manufacturing system comprising: a resin molding die which includes a cavity, a resin reservoir in direct contact with the cavity and housing a resin for substantially filling the cavity, and a pusher injecting the resin into the cavity from the resin reservoir; a plunger for driving the pusher of the resin molding die; a plunger driving unit for driving the plunger; and a control unit for driving the plunger driving unit.

DESCRIPTION OF THE PREFERRED EMBODIMENTS

The invention will be described with reference to the embodiments shown in the accompanying drawings.

(First Embodiment)

In this embodiment of the invention is applied to a semiconductor device having the ball grid array structure, a method of manufacturing the semiconductor device, a resin molding die used by the foregoing method, and a semiconductor manufacturing system for manufacturing semiconductor devices according to the foregoing method.

[Structure of Semiconductor Device]

Figure 1:
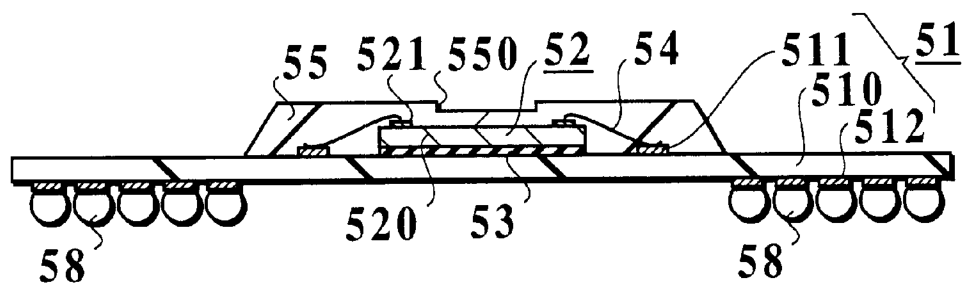
FIG. 1 is a cross section of a semiconductor device according to a first embodiment of the invention.
Figure 2:
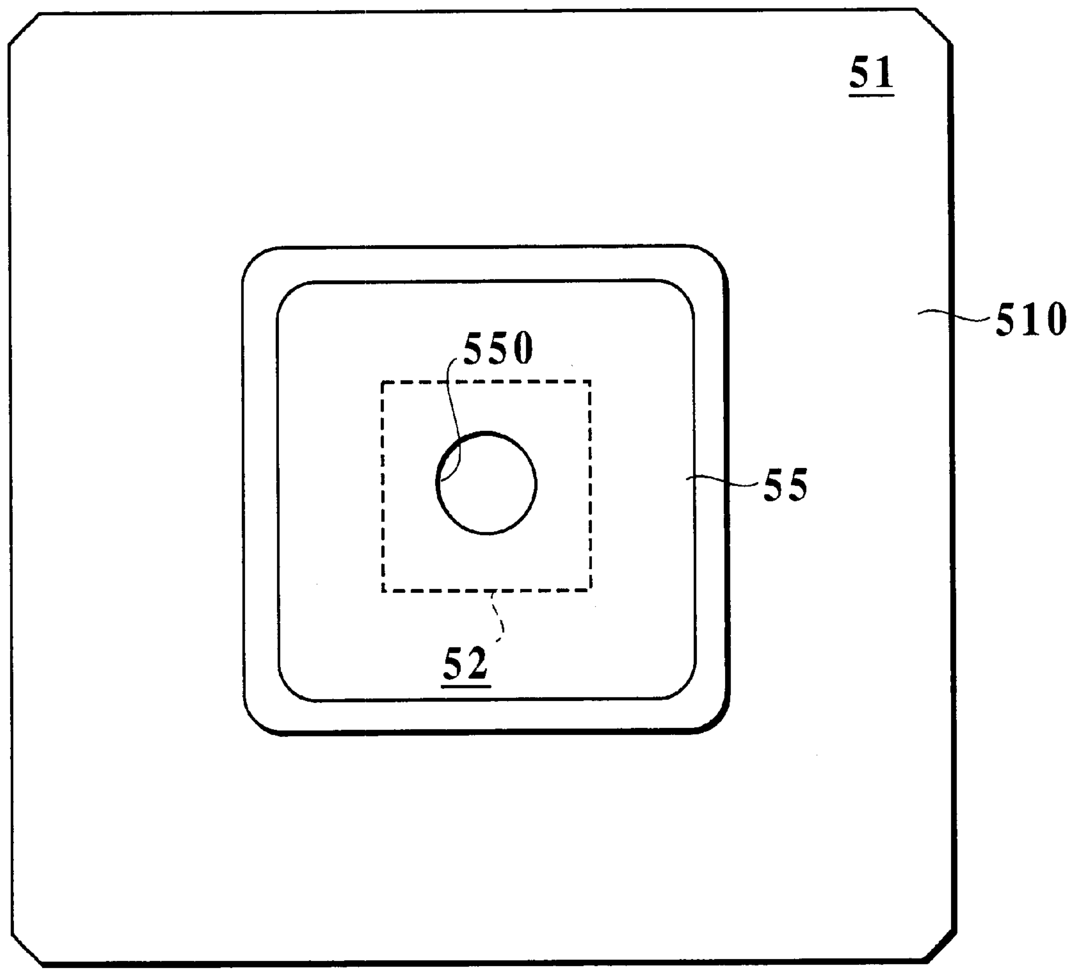
FIG. 2 is a top plan view of the semiconductor device of FIG. 1.

Referring to FIG. 1 and FIG. 2, a semiconductor device 50 comprises: a base 51; a semiconductor element 52 provided on the base 51; and a resin seal 55 encapsulating the semiconductor element 52 on the base 51 and having a recess 550 positioned above the semiconductor element 52.

The base 51 has a semiconductor element 52 mounted thereon and is partially encapsulated together with the semiconductor element 52 by a resin seal 55. The base 51 is constituted at least by a circuit board, a wiring board, an insulated substrate, a tape substrate, a resin substrate, a ceramics substrate, a power source substrate, a radiating substrate, or a lead (i.e. a lead frame which a resin is being filled). In this embodiment, the base 51 is a wiring board, and includes an insulated substrate 510, a terminal 511 provided on the front surface thereof (upper surface in FIG. 1), and a terminal 512 provided on the rear surface thereof (lower surface in FIG. 1). Although not shown in detail, the terminals 511 and 512 are electrically connected by a through-hole wiring extending through the insulated substrate 510. The insulated substrate 510 may be a plastic substrate made of an epoxy group resin, polyimide group resin or the like, a tape substrate, a ceramics substrate or the like. The terminals 511 and 512 may be made of copper (Cu) foils, copper alloy foils, or composite films including copper foils and copper alloy foils. All of these materials have excellent electrical conductivity. The terminals 511 and 512 are deposited by the sputtering process and are patterned by the etching. And, the terminals 511 and 512 are formed by plating or printing process. External connection terminals 58 made of solder balls are electrically and mechanically connected to the terminal 512 on the rear surface of the base 51.

The semiconductor element 52 is constituted by a silicon single crystal chip 520, and includes on its main surface (upper surface in FIG. 1) a plurality of elements such as insulated gate filed effect transistors (IGFET), bipolar transistors, resistance elements, capacitance elements and so on, which are not shown in FIG. 1. Between these elements, it is electrically connected by the wirings. Further, the semiconductor element 52 is provided with circuits such as a logic circuit or a memory circuit or a mixture of the logic and memory circuits.

The semiconductor device 50 is preferable to encapsulate the semiconductor element 52 of the semiconductor device 50 which includes CPU, MPU circuits so on generating a lot of calories during their operations. An external terminal (bonding pad) 521 is provided on the main surface of the semiconductor element 52 in order to electrically connect the foregoing circuits to the terminal 511. The bonding pad 521 is flush with an uppermost wiring for connecting the foregoing elements and is made of the material same as that of the uppermost wiring, e.g. an aluminum alloy (Al—Si, Al—Cu, or Al—Cu—Si) film.

The semiconductor element 52 is mounted on the front center of the base 51 in a face-up state, i.e. is mounted on the front surface of the insulated substrate 510 via a resin adhesive 53.

When an electrode is formed on the rear surface of the semiconductor element 52, the terminal 511 is positioned on the front center of the insulated substrate 510, the semiconductor element 52 is electrically connected to and is mechanically mounted on the terminal 511 via a jointing material layer made of a gold germanium alloy (Au—Ge), a gold-silicon alloy (Au—Si), a gold tin alloy (Au—Sn) or the like.

Alternatively, the semiconductor element 52 may be bonded or mounted on the base 51 by the tape-automated bonding process (TAB), flip-chip bonding method (FCB) or the like. In the case of the TAB process, the base 51 is a tape substrate having an opening at the center thereof in order to mount the semiconductor element 52 therein. The base 51 also has a lead (finger lead) projecting in the foregoing opening. The external terminal 521 of the semiconductor element 52 is electrically and mechanically bonded to the lead by the thermo-compression process via a solder bump electrode, an Au bump electrode or the like. The semiconductor element 52 is bonded in the face-up or face-down state. With the FCB process, a lead wiring is provided on the base 51 made of a plastic substrate, a ceramics substrate or the like, and is bonded to the external terminal 521 of the semiconductor element 52. The lead wiring and external terminal 521 are electrically and mechanically connected via a bump electrode. The semiconductor element 52 is bonded in the face-down state.

The external terminal 521 of the semiconductor element 52 and the terminal 511 of the base 51 are electrically connected by wires (e.g. bonding wires) 54 such as Au wires, Al wires or the like.

The resin seal 55 hermetically encapsulates the semiconductor element 52, wires 54 and terminal 511 at the front center of the base 51 in order to protect them against ambient conditions. The resin seal 55 is molded by the direct transfer molding process (as will be described later), and is made of an epoxy group resin.

The recess 550 at the upper center of the resin seal 55, i.e. just above the semiconductor element 52, is formed by removing a part of the resin seal 55 in order to reduce the volume of the resin seal 55. In the direct transfer molding process, the recess 550 is formed at a contact area between a cylindrical resin reservoir (622) and a cavity (621) of a resin molding die (60), and is intentionally made by slightly reducing an amount of a resin (55A) to be filled in the cavity (621) (refer to FIG. 3).

The resin seal 55 is thinner at the recess 550 than at the other part of the resin seal 55. Therefore, the recess 550 easily radiates heat generated during the operation of the semiconductor element 52 compared with the other part of the resin seal 55, and serves as a radiating path. As a whole, the resin seal 55 is thick enough to keep its own mechanical strength. By the way, the resin seal 55 sometimes has recesses which are caused by ejection pins (602) used to unclamp the resin molding die (60) after the mold encapsulation process is completed (refer to FIG. 3). However, the recess 550 of the resin seal 55 is formed at the position where the resin seal 55 is in direct contact with the resin reservoir (622) of the resin molding die, and fundamentally differs from the recesses caused by the ejection pins (602). In other words, the recess 550 is wider than the recesses caused by the ejection pins (602).

The resin seal 55 is thin at its recess 550 which serves as the radiating path, so that the radiating function of the semiconductor device 50 is improved. Further, the resin seal 55 is thick at the area surrounding the recess 550, thereby improving the mechanical strength thereof. Therefore, the semiconductor device 50 can be reliably mounted on a mounting board (e.g. a mother board, a daughter board and so on) or on equipment (e.g. a computer, a game machine and so on) in which the semiconductor device 50 is incorporated and assure reliable operation.

[Structure of Resin Molding Die]

Figure 3:
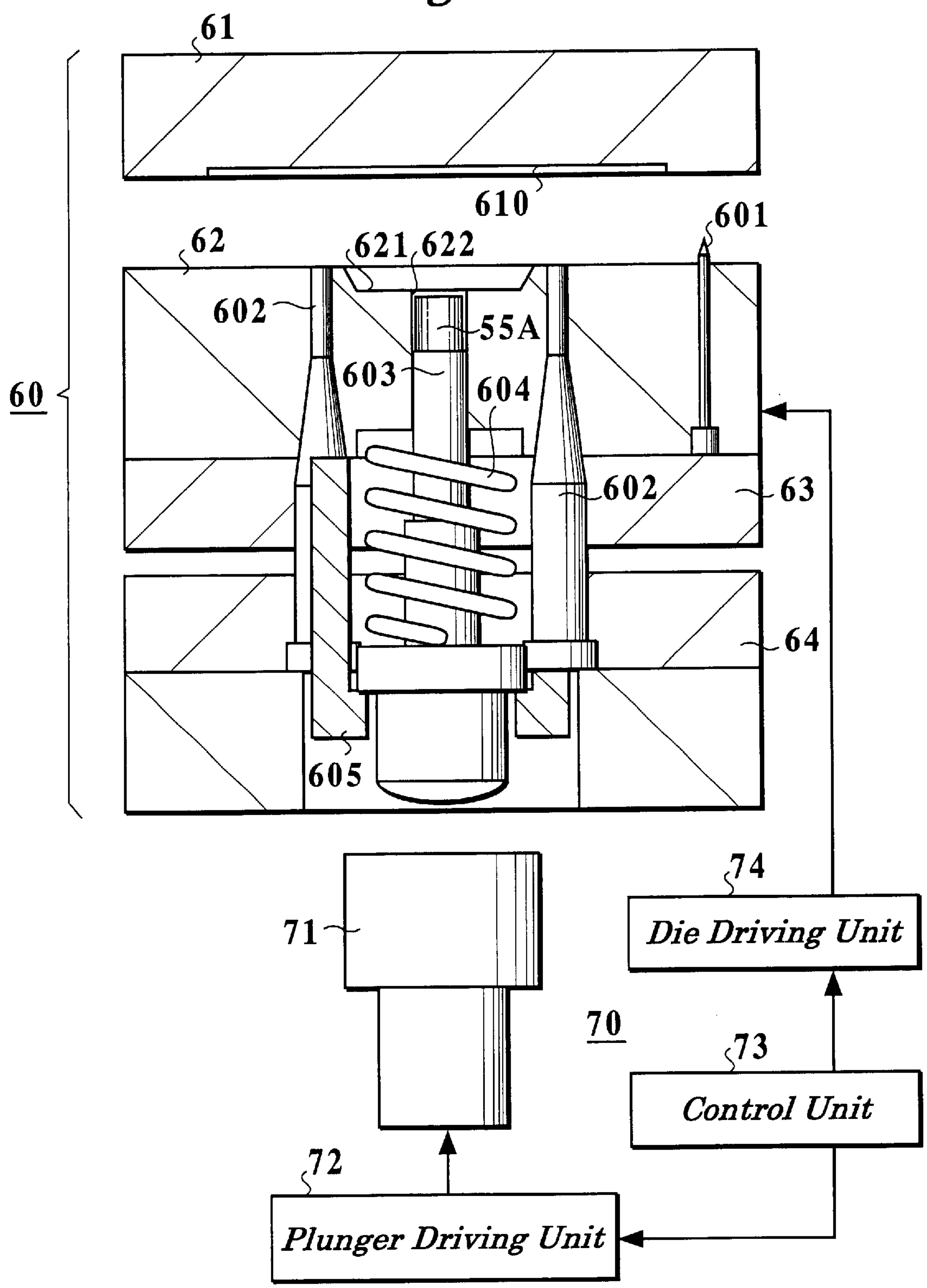
FIG. 3 is a cross section of a resin molding die used in the first embodiment and a block diagram of a semiconductor manufacturing system.

Referring to FIG. 3, the resin molding die 60 for forming the resin seal 55 of the semiconductor device 50 comprises at least: a cavity 621; a resin reservoir 622 housing the resin 55A for substantially filling the cavity 621 and being in direct contact with the cavity 621; and a pusher 603 injecting the resin 55A in the cavity 621. In the resin molding die 60, a upper cavity block 61, a lower cavity block 62, a lower cavity base 63 and a mold base 64 are stacked one over after another with the mold base 64 positioned at the bottom.

The upper cavity block 61 has on its lower surface a base cavity 610 for receiving the base 51.

The lower cavity block 62 has on its upper surface the cavity 621 for molding the resin seal 55 and facing with the base cavity 610. In the lower cavity block 62, an upper end of the cylindrical resin reservoir 622 is in direct contact with the bottom center of the cavity 621. The pusher 603 is housed in the resin reservoir 622, and slides up and down therein in order to inject the resin 55A into the cavity 621. In the resin molding die 60, the pusher 603 has its top slightly projecting into the cavity 621, thereby forming the recess 550 on the resin seal 55. A volume derived by multiplying an inner diameter of the resin reservoir 622 and a slide stroke of the pusher 603 is approximately equal to a volume of the cavity 621. A volume of the resin 55A or the resin reservoir 622 is designed to be slightly smaller than the volume of the cavity 621 since the recess 550 is formed on the resin seal 55. In other words, the resin reservoir 622 is independent from the cavity 621 in order that the resin 55A can be directly injected into the cavity 621 without via a cull, a runner and a resin gate.

The pusher 603 is housed in a container (or a box) 605 extending between the lower cavity block 62 and the mold base 64 with a resilient member 604 fitted therein, which urges the pusher 603 toward the bottom of the resin reservoir 622. The resilient member 604 is preferably a coil spring. The pusher 603 is independent from a plunger 71, and is in contact with the plunger 71 via its rounded lower end. The plunger 71 pushes the pusher 603 upward, which then fills the cavity 621 with the resin 55A from the resin reservoir 622.

The lower cavity block 62 includes a pilot pin 601 for alignment with the upper cavity block 61, and ejection pins 602 for separating the resin seal 55 out of the cavity 621. For example, four ejection pins 602 are provided around the resin reservoir 622. An open top of each ejection pin 602 is smaller than an open top of the resin reservoir 622 and is not filled with the resin 55A because the ejection pins 602 are used only to separate the resin seal 55.

Still, in this embodiment, the ejection pin 602 would be pushing the base 51. When the ejection pin 602 pushes the resin seal 55, the scar of the ejection pin 602 is formed for the resin seal 55. An area of the scar of the ejection pin 602 is smaller than an open top of the resin reservoir 622.

In this embodiment, the resin molding die 60 includes at least the resin reservoir 622 in direct contact with the cavity 621, and the pusher 603 for injecting the resin 55A into the cavity 621, and is used to produce the resin seal 55 for the semiconductor device 50. Further, since the pusher 603 is included in the resin molding die 60, it is not necessary to assemble the plunger 71 in such a manner that it enters into the resin molding die 60. Therefore, resin molding can be performed only by setting the resin molding die 60 above the plunger 71 such that it is in contact with the pusher 603.

[Structure of Semiconductor Manufacturing System]

Referring to FIG. 3, a semiconductor manufacturing system (i.e. a direct transfer molding system) 70 for molding the resin seal 55 comprises at least: the resin molding die 60 (which is detachable); the plunger 71 for vertically moving the pusher 603 of the resin molding die 60; a plunger driving unit 72; a die driving unit 74 for driving at least the upper or lower cavity block 61 or 62 (i.e. the lower cavity block 62 in the first embodiment); and a control unit 73 for controlling the plunger driving unit 72 and the die driving unit 74.

The plunger 71 is not mechanically coupled to but is in contact with the pusher 603 as described above. In the resin molding die 60, the pusher 603 is designed to slide up and down. Therefore, the plunger 71 has an axial length to exert a force to the pusher 603 for injecting the resin 55A. The pusher 603 has a round bottom in order to alleviate anti-axial stress which is applied to the plunger 71 and is caused by a sliding resistance during the injection of the resin 55A or minute assembly errors. As a result, only the axial stress is applied to the plunger 71. It is possible to protect the pusher 603 against damages caused by the inclination of the plunger 71 and so on. Further, the pusher 603 is usually urged downward by the resilient member 604, so that substantially no stress is applied to the plunger 71 when it retracts after the resin 55A is filled. This feature is effective in protecting the pusher 603 against damages caused by the inclination of the plunger 71.

Each of the plunger driving unit 72 and die driving unit 74 may be constituted by a pneumatic cylinder, a hydraulic cylinder, or a combination of an electric motor and a hoisting mechanism. The control unit 73 is constituted at least by a micro-processor, a memory, a control panel and so on in order to control the plunger driving unit 72 and the die driving unit 74.

This semiconductor manufacturing system 70 can mold the resin seal 55 and manufacture the semiconductor device 50.

[Method of Manufacturing Semiconductor Device]

The method of manufacturing the semiconductor device 50 (i.e. the direct transfer molding process) will be described with reference to FIG. 4A and FIG. 4B.

Figure 4:
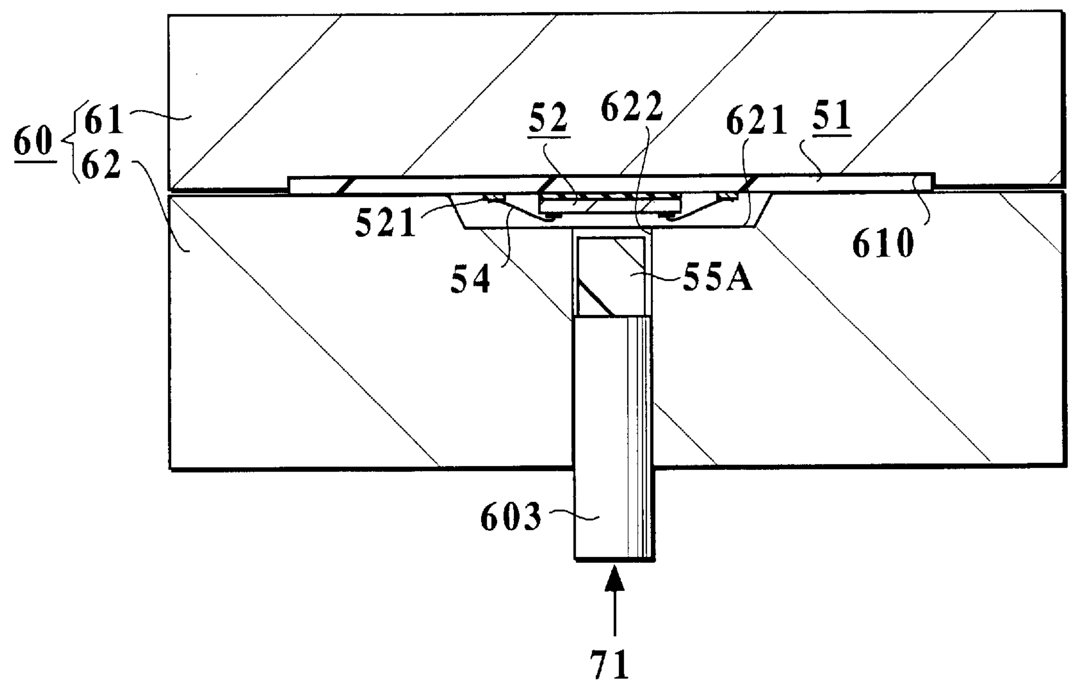
FIG. 4A and FIG. 4B are cross sections of the semiconductor device and the resin molding die, showing how the semiconductor device is manufactured.
Figure 4:
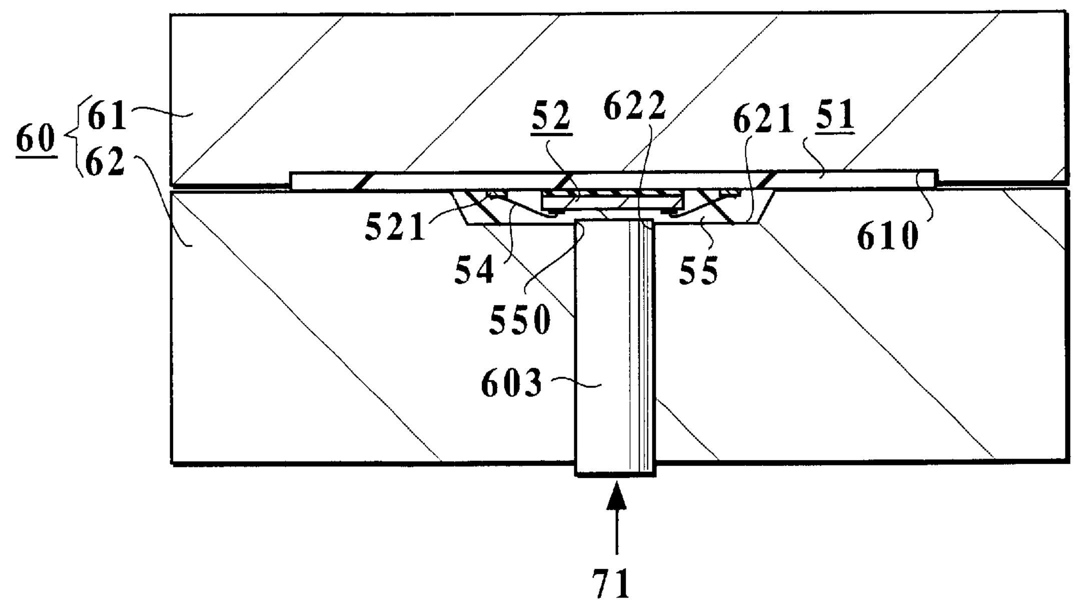

(1) First of all, the base 51 is placed on the lower cavity block in such a manner that the semiconductor element 52 as well as a part of the base 51 is fitted in the cavity 621 of the resin molding die 60 (see FIG. 4A). In this state, the semiconductor element 52 has been mounted on the base 51, and the terminal 511 of the base 51 and the external terminal 521 of the semiconductor element 52 have been electrically connected by the wires 54. Since the cavity 621 is present on the lower cavity block 62, the base 51 is placed on the lower cavity block 62 with the semiconductor element 52 facing down.

(2) The resin 55A is supplied to the resin reservoir 622, which is at the center of the cavity 621 and is above the center of the semiconductor element 52 (see FIG. 4A). The resin 55A is then injected in order to substantially fill the cavity 621. The amount of the resin 55A is determined on the basis of the volume of the cavity 621 after deducting the volume of the components such as the semiconductor element 52 and the wire 54 a and so on in the cavity 621. Further, the amount of the resin 55A is slightly reduced taking the recess 550 into consideration. The resin 55A may be a tablet or powder resin. Still further, before or after injecting the resin 55A into the resin reservoir 622, the lower cavity block 62 is heated by a heater (not shown), and is maintained at a temperature of 165° C. to 185° C. in order to melt the resin 55A.

(3) The lower cavity block 62 is raised toward the upper cavity block 61 by the operation of the die driving unit 74 and the control unit 73 (which are shown in FIG. 3), so that the upper and lower cavity blocks 61 and 62 are clamped as shown in FIG. 4A. Therefore, the base 51 is received in the base cavity 610 of the upper cavity block 61.

(4) Since the resin molding die 60 remains hot, the resin 55A is melted in the resin reservoir 622, and is injected into the cavity 621 by the pusher 603 via the resin reservoir 622 as shown in FIG. 4B. The pusher 603 is moved upward by the plunger driving unit 72 and the control unit 73. Specifically, the pusher 603 injects the resin 55A into the cavity 621 with a pressure of approximately 5 MPa to 15 MPa and a sufficient injection stroke via the resin reservoir 622. Further, the pusher 603 slightly projects into the cavity 621 in order to form the recess 550. In this state, the resin 55A is heated for approximately 40 seconds to 180 seconds, and is then hardened in order to form the resin seal 55 which encapsulates at least the semiconductor element 52 as well as a part of the base 51, and has the recess 550.

(5) Thereafter, the lower cavity block 62 is lowered by the die driving unit 74 and the control unit 73. The upper and lower cavity blocks 61 and 62 are unclamped, so that the molded semiconductor device 50 is removed from the resin molding die 60 using the ejection pins 602.

In this state, the semiconductor device 50 is completed by the direct transfer molding process.

In the foregoing manufacturing method, all of the resin 55A in the resin reservoir 622 is injected into the cavity 621 in order to form the resin seal 55, so that there is no superfluous resin which might form a cull, runner or resin gate. In other words, the molded resin seal 55 itself can be treated as the complete product which does not need any gate-breaking. Therefore, it is possible to reduce an amount of the resin to be used and an amount of the resin to be discarded. Further, it is possible to remarkably reduce the manufacturing cost of the semiconductor device 50 since no post treatment is required. This also leads to the reduction of the product cost of the semiconductor device 50.

Further, the resin seal 55 does not peel off or is not cracked since no gate-breaking is performed after the resin 55A is filled in the cavity 621. As a result, the manufactured semiconductor device 50 becomes more resistant against external conditions, which improves the manufacturing yield thereof.

Still further, all of the resin 55A in the resin reservoir 622 is uniformly injected into the cavity 62 with a sufficient injection stroke, so that it is possible to reduce voids in the resin seal 55, to strengthen an adhesive force between the resin seal 55 and the base 51, and improve the manufacturing yield of the semiconductor device 50.

Since the resin 55A is injected into the cavity 621 via the resin reservoir 622 above the semiconductor element 52, it is possible to obviate the resin 55A passing over the base 51 via a runner and a resin gate. In other words, the base 51 of the semiconductor device 50 is free from a metal part which promotes the gate-breaking. The base 51 can be downsized as a whole (since the terminal 511 is arranged at a position where the metal part may be provided), which means that the semiconductor device 50 can be downsized in this manufacturing method.

Figure 31:
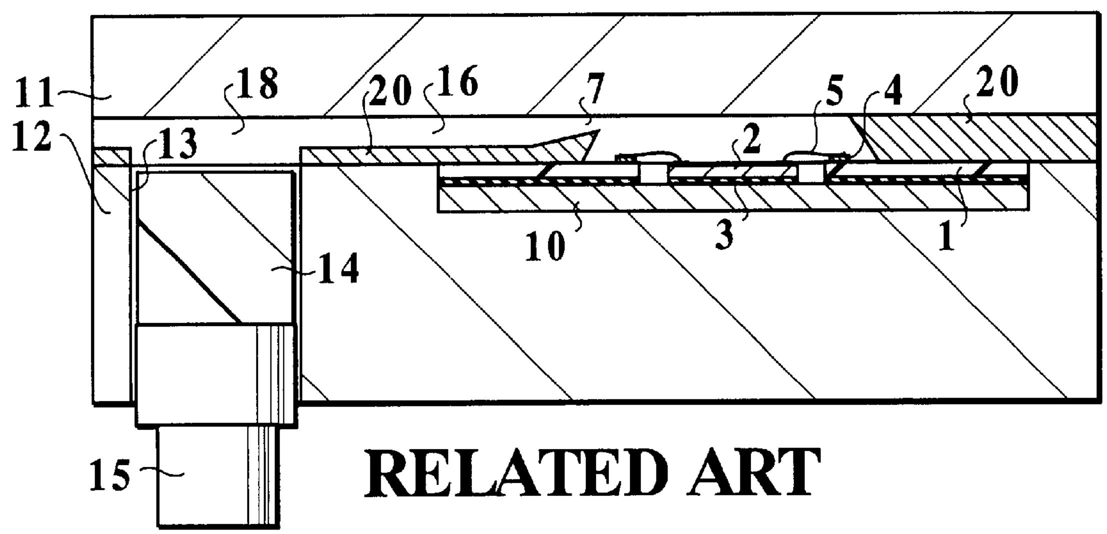
FIG. 31 is a cross section showing how a first resin molding process is performed for the semiconductor device shown in FIG. 27 and FIG. 28.
Figure 32:
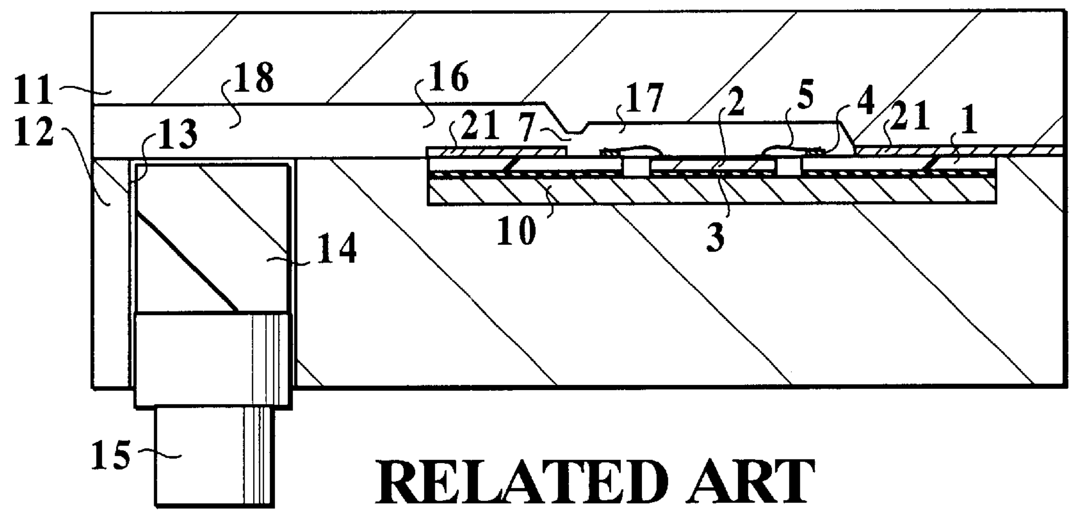
FIG. 32 is a cross section showing how a second resin molding process is performed for the semiconductor device shown in FIG. 27 and FIG. 28.

This manufacturing method requires neither the additional die or the plate 20 used in the first resin molding process for the semiconductor device shown in FIG. 31 nor the sheet 21 used in the second resin molding process for the semiconductor device shown in FIG. 32, which means that no dedicated device for attaching the foregoing components is also necessary. This can reduce the manufacturing cost of the semiconductor device 50.

Figure 33:
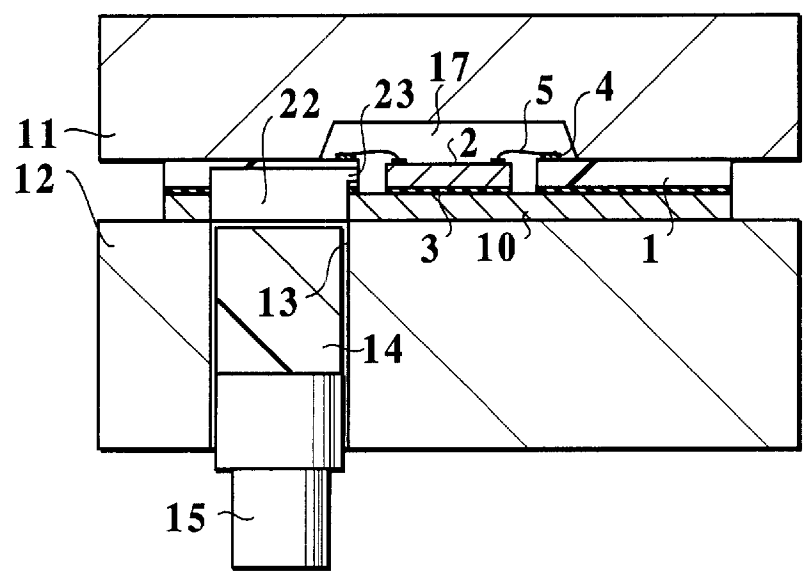
FIG. 33 is a cross section showing how a third resin molding process is performed for the semiconductor device shown in FIG. 27 and FIG. 28.
Figure 34:
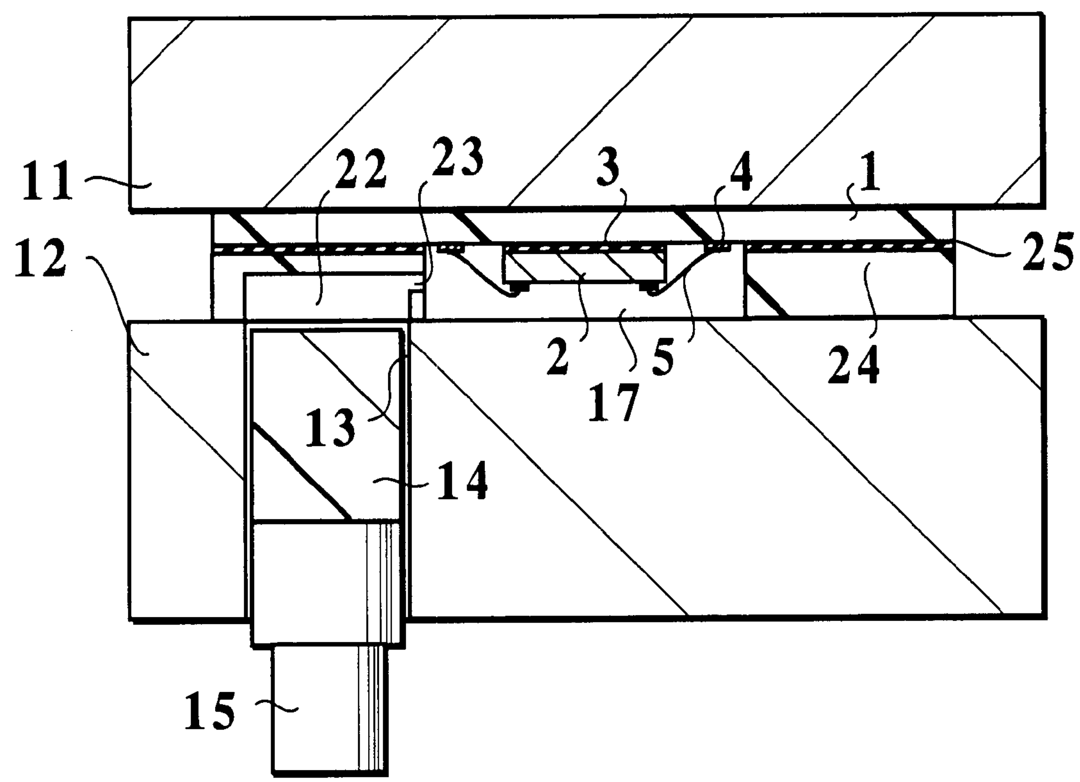
FIG. 34 is a cross section showing how a fourth resin molding process is performed for the semiconductor device of the related art.

In the third and fourth resin molding processes for the semiconductor devices shown in FIG. 33 and FIG. 34, it is necessary to provide the special resin inlet 22 and resin outlet 23 in the substrate 1, plate 10 and frame 24. However, the manufacturing method of this invention does not require any resin inlet and resin outlet in the base 51. Therefore, the manufacturing cost of the semiconductor device 50 can be reduced. In addition, it is possible to improve the mechanical strength of the base 51, and reliability and manufacturing yield of the semiconductor device 50.

According to the first embodiment, all of the resin 55A stored in the resin reservoir 622 is injected into the cavity 621 from the center thereof (i.e. from the center of the cavity 621 facing with the upper surface of the semiconductor element 52) to the peripheral part of the cavity 621. As a result, the resin 55A can be uniformly filled in the cavity 621, voids are reduced, and the manufacturing yield of the semiconductor device 50 can be improved.

When a plurality of wires 54 are radially bonded from the center of the semiconductor element 52, they can be made to extend in the same direction in which the resin 55A is injected (i.e. substantially in parallel). Therefore, shorting of adjacent wires 54 can be prevented because the resin 55A does not flow in the direction which intersects the extending direction of the wires 54. This is effective in improving the manufacturing yield.

(Second Embodiment)

This embodiment differs from the first embodiment in the shape of the resin seal 55 of the semiconductor device 50.

[Structure of Semiconductor Device]

Figure 5:
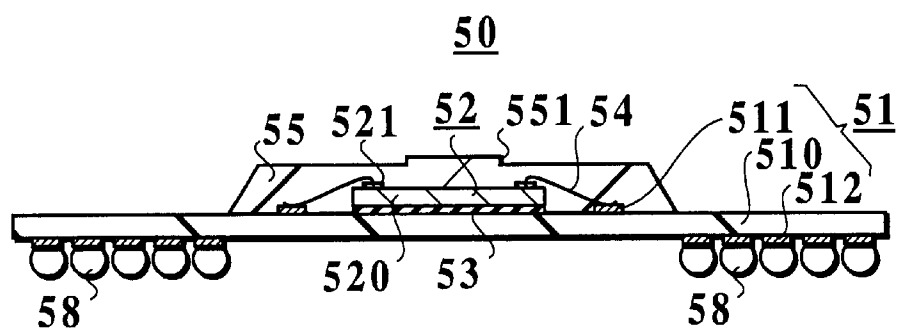
FIG. 5 is a cross section of a semiconductor device according to a second embodiment of the invention.

Referring to FIG. 5, the semiconductor device 50 comprises the base 51, the semiconductor element 52 on the base 51, and the resin seal 55 which encapsulates a part of the base 51 as well as the semiconductor element 52 and has a protrusion 551. The base 51 and semiconductor element 52 are identical to those of the first embodiment, and will not be described in detail.

The resin seal 55 hermetically encapsulates the semiconductor element 52, wires 54 and the terminal 511 on the center of the base 51 in order to protect them against ambient conditions. The resin seal 55 is molded by the direct transfer molding process similarly to the resin seal 55 of the first embodiment, and is made of an epoxy group resin, for example.

The resin seal 55 has the protrusion 551 at the center thereof just above the semiconductor element 52, and is in contact with other components only via the protrusion 551 with a gap maintained around itself. Here, the "other components" refer to equipment in which the semiconductor device 50 is incorporated, a wiring board mounted on the semiconductor device 50, and so on. With semiconductor devices 50 of ninth and tenth embodiments to be described later (shown in FIG. 18, FIG. 19 and FIG. 21), the "other components" refer to equipment in which the semiconductor device 50 is incorporated, a wiring board mounted on the semiconductor device 50, and so on if semiconductor elements 52 and resin seals 55 are provided on rear surfaces of bases 51. The gap has a size for enabling a cleaning agent or air to flow therethrough. The protrusion 551 is formed while the resin seal 55 is made by the direct transfer molding process, as in the semiconductor device 50 of the first embodiment. Specifically, the protrusion 551 is intentionally formed at a position where the resin reservoir 622 is in direct contact with the cavity 621. The amount of the resin 55A to be injected into the cavity 621 is somewhat increased in order to form the protrusion 551 (refer to FIG. 6).

In the semiconductor device 50 of the second embodiment, the protrusion 551 serves as a radiating path, thereby assuring excellent radiating performance. Especially, the protrusion 551 is positioned above and extends over the semiconductor element 52, so that it is possible to radiate heat, which is generated by the circuit operation of the semiconductor element 52, through the shortest radiating path (with a minimum heat resistance). Further, there is the gap around the protrusion 551, which enables the cleaning agent or air to smoothly flow therethrough during the cleaning and drying processes after the semiconductor device 50 is mounted on a mounting board or equipment in which the semiconductor device is incorporated. This is effective in improving the manufacturing yield, reducing mounting errors and producing the reliable semiconductor device 50.

[Method of Manufacturing Semiconductor Device]

Figure 6:
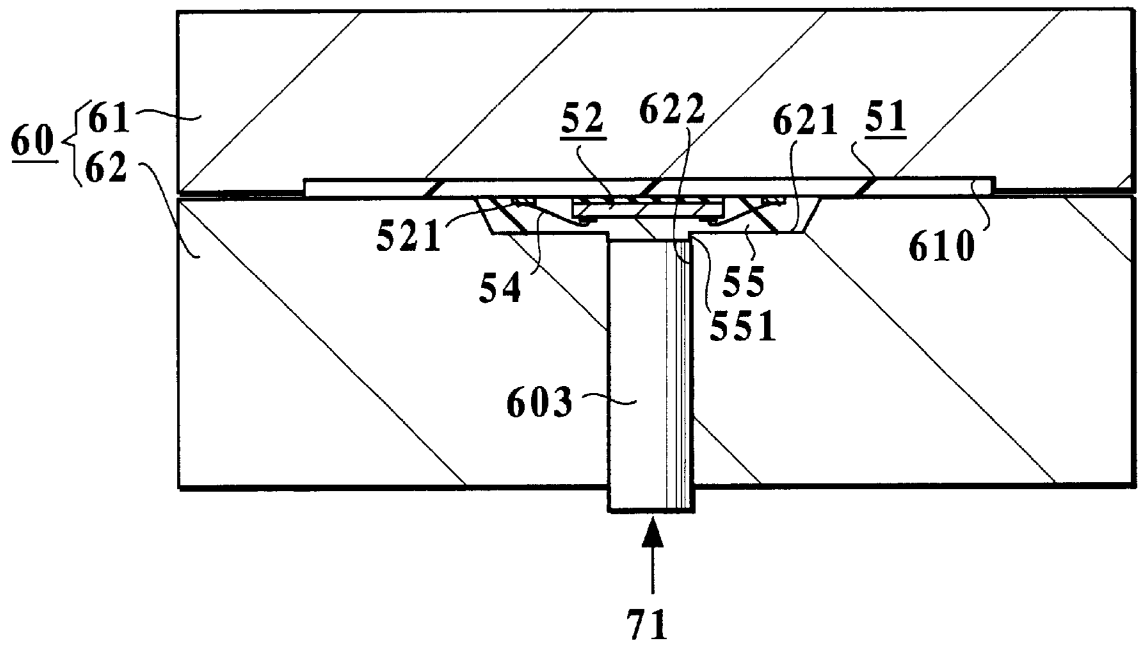
FIG. 6 is a cross section of the semiconductor device of FIG. 5 and a resin molding die, showing how the semiconductor device is manufactured.

The semiconductor device 50 is produced by the direct transfer molding process as shown in FIG. 6. The resin seal 55 is molded by the resin molding die 60 and the semiconductor manufacturing system 70 which are used in the first embodiment, so that their structures will not be described in detail.

(1) First of all, the base 51 is placed on the lower cavity block 62 in such a manner that the semiconductor element 52 as well as a part of the base 51 is fitted in the cavity 621 of the resin molding die 60 (see FIG. 4A).

(2) The resin 55A is supplied to the resin reservoir 622, which is at the center of the cavity 621 and is above the center of the semiconductor element 52. The resin 55A is then injected in order to substantially fill the cavity 621. Further, the amount of the resin 55A is somewhat increased for the protrusion 551. Still further, before or after supplying the resin 55A to the resin reservoir 622, the lower cavity block 62 is maintained at a temperature to melt the resin 55A.

(3) The upper and lower cavity blocks 61 and 62 are clamped as shown in FIG. 4A. Thereafter, the resin 55A is injected into the cavity 621 by the pusher 603 via the resin reservoir 622. In this case, the pusher 603 injects the resin 55A with an appropriate pressure to the resin 55A and a sufficient injecting stroke. The volume of the resin 55A is slightly larger than the volume of the cavity 621. When the pressure applied by the pusher 603 reaches a predetermined value, the control unit 73 detects the load of the plunger driving unit 72 of the semiconductor manufacturing system 70 shown in FIG. 3. The pusher 603 stop injecting the resin 55A slightly before it reaches the cavity 621. Then, the resin 55A is hardened, thereby forming the resin seal 55 which encapsulates a part of the base 51 as well as the semiconductor element 52, and has the protrusion 551.

(4) Thereafter, the upper and lower cavity blocks 61 and 62 are unclamped in order to remove the semiconductor device 50 having the resin seal 55, from the resin molding die 60.

In this state, the semiconductor device 50 is completed by the direct transfer molding process.

The method of manufacturing the semiconductor device 50 of the second embodiment is as effective and advantageous as that of the first embodiment.

(Third Embodiment)

In this embodiment, a semiconductor device 50 is substantially identical to the semiconductor device 50 of the first embodiment except for the shape of the base 51.

[Structure of Semiconductor Device]

Figure 7:
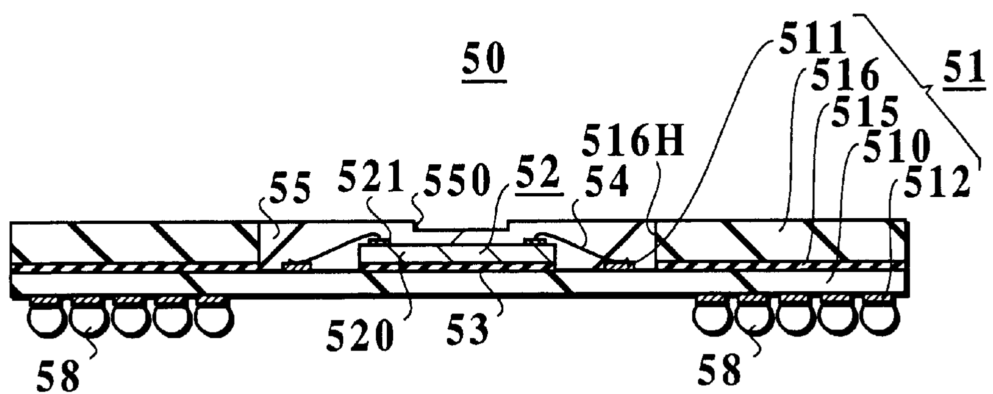
FIG. 7 is a cross section of a semiconductor device according to a third embodiment of the invention.
Figure 8:
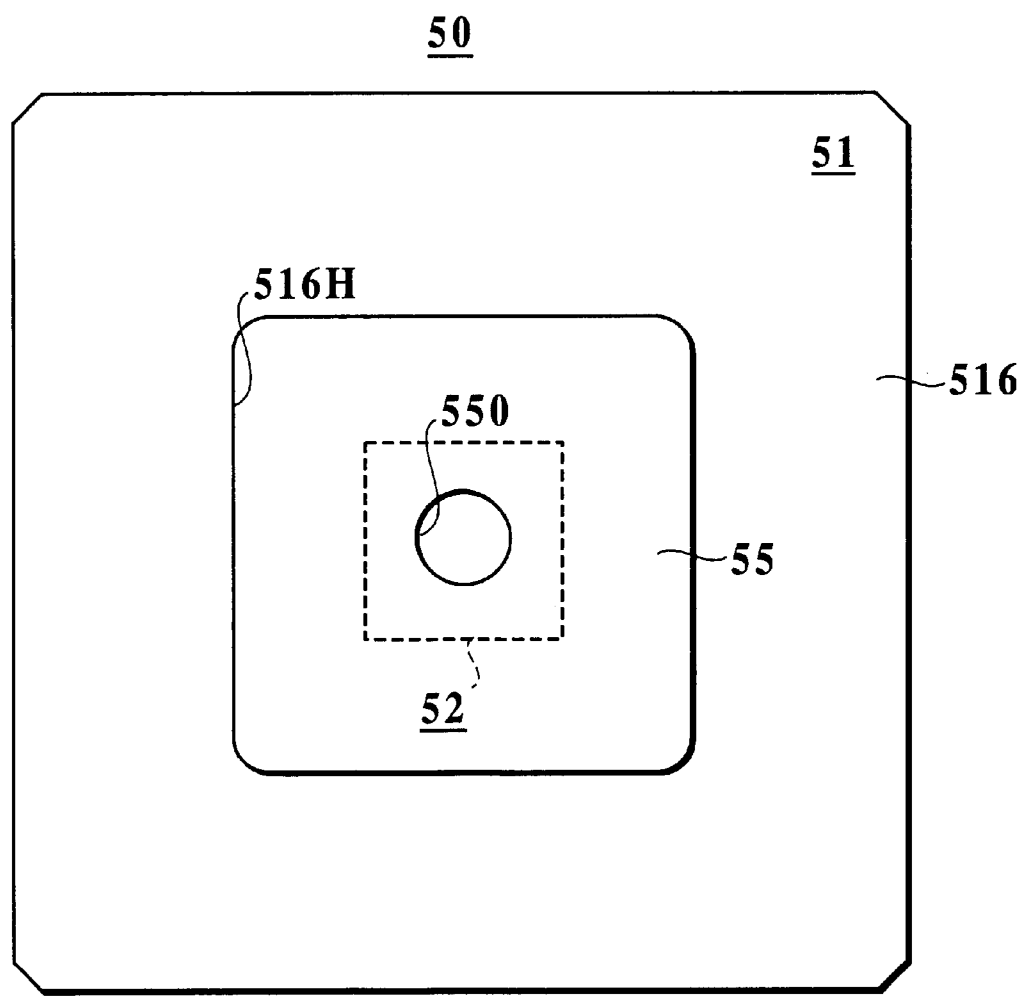
FIG. 8 is a top plan view of the semiconductor device of FIG. 7.

Referring to FIG. 7 and FIG. 8, the semiconductor device 50 comprises the base 51, the semiconductor element 52 on the base 51, and the resin seal 55 encapsulating the semiconductor element 52 and having the recess 550. The semiconductor element 52 is identical to that of the first embodiment, and will not be described here.

The base 51 is constituted at least by: an insulated substrate 510, in this embodiment; a frame 516 which is positioned on the front surface (upper surface in FIG. 7) of the insulated substrate 510, and has an opening 516H at the center thereof in order to house the semiconductor element 52 and the resin seal 55; an adhesive layer 515 provided between the insulated substrate 510 and the frame 516; a terminal 511 provided on the front surface of the insulated substrate 510 (upper surface in FIG. 7); and a terminal 512 provided on the rear surface of the insulated substrate 510 (lower surface in FIG. 7). The terminal 511 is positioned in the opening 516H of the frame 516. Although not shown in detail, the terminals 511 and 512 are electrically connected by a through-hole wiring extending through the insulated substrate 510. The insulated substrate 510 is a plastic substrate made of an epoxy group resin, a polyimide resin or the like, a tape substrate, a ceramics substrate or the like. The terminals 511 and 512 are made of Cu foils, Cu alloy foils, or a composite film made of the foregoing foils.

The frame 516 is made of an epoxy group resin, ceramics, silicon carbide, a film, a tape, rubber, metal, alloy, or the like. The frame 516 protects the semiconductor element 52 against external stress, improves the mechanical strength of the base 51 and the overall flatness of the semiconductor device 50, and functions as a dam during the molding of the resin seal 55. The adhesive 515 is an insulated resin adhesive, for example.

The resin seal 55 has the recess 550 at the center thereof similarly to the resin seal 55 of the first embodiment. However, the periphery of the resin seal 55 is in contact with an inner wall of the opening 516H of the frame 516. The resin seal 55 is positioned in the opening 516H, and is designed such that the upper periphery thereof is flush with the upper surface of the frame 516. Therefore, the semiconductor device 50 is in the shape of a plate since the resin seal 55 is substantially flat. The recess 550 at the center of the resin seal 55 is set back toward the insulated substrate 510 with respect to the upper surface of the frame 516. The resin seal 55 is molded by the direct transfer molding process, and is made of the epoxy group resin, similarly to the resin seal 55 of the first embodiment.

The semiconductor device 50 of the third embodiment is as effective and advantageous as the semiconductor device 50 of the first embodiment.

[Method of Manufacturing Semiconductor Device]

Figure 9:
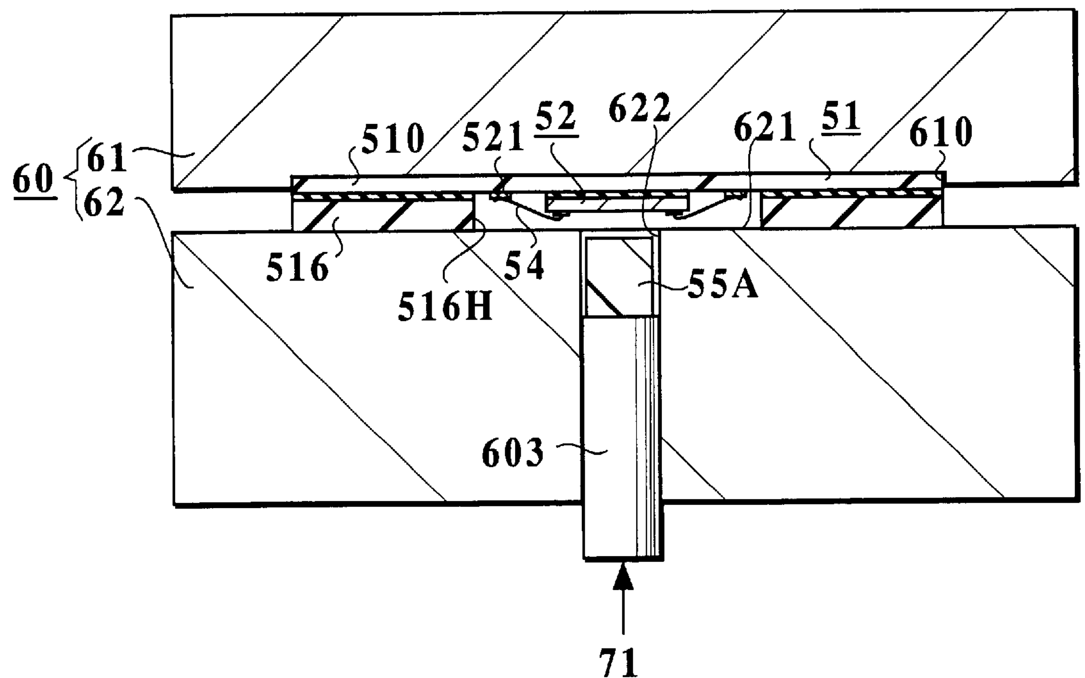
FIG. 9 a cross section of the semiconductor device of FIG. 7 and a resin molding die, showing how the semiconductor device is manufactured.

The semiconductor device 50 is manufactured by the direct transfer molding process as shown in FIG. 9. The resin molding die 60 and the semiconductor manufacturing system 70 of the first embodiment are also used in this embodiment, and will not be described here.

(1) First of all, the base 51 is placed on the lower cavity block 62 in such a manner that the semiconductor element 52 as well as a part of the base 51 is fitted in the cavity 621 of the resin molding die 60 (see FIG. 9). Since the base 51 includes the frame 516 having the opening 516H, the cavity 621 is defined by the front center of the insulated substrate 510 of the base 51, the frame 516 and the upper surface of the lower cavity block 62. Therefore, the lower cavity block 62 is not required to have the cavity 621 and is flat, contrary to the lower cavity block 62 of the first embodiment. It is possible to simplify the structure of the resin molding die 60, and to reduce the manufacturing cost thereof.

(2) The resin 55A is supplied into the resin reservoir 622, which is at the center of the cavity 621 and is above the center of the semiconductor element 52 (see FIG. 9). The resin 55A is then injected into the cavity 621 in order to fill it substantially. The amount of the resin 55A is determined on the basis of the volume of the cavity 621, and the volume of the recess 550 of the resin seal 55. The lower cavity block 62 is maintained at a temperature to melt the resin 55A.

(3) The upper and lower cavity blocks 61 and 62 are clamped as shown in FIG. 9. Thereafter, the melted resin 55A is injected into the cavity 621 by the pusher 603 via the resin reservoir 622. The pusher 603 injects all of the resin 55A into the cavity 621 with an appropriate pressure and a sufficient injection stroke. Further, the pusher 603 slightly projects into the cavity 621 in order to form the recess 550. In this state, the resin 55A is hardened in order to form the resin seal 55 which encapsulates at least the semiconductor element 52 as well as a part of the base 51 and has the recess 550 (see FIG. 4B).

(4) Thereafter, the upper and lower cavity blocks 61 and 62 are unclamped in order to remove the semiconductor device 50 having the resin seal 55, from the resin molding die 60.

In this state, the semiconductor device 50 is completed by the direct transfer molding process.

The method of manufacturing the semiconductor device 50 of the third embodiment is as effective and advantageous as that of the first embodiment.

In this embodiment, the base 51 includes the frame 516 having the opening 516H which serves as the cavity 621, so that the lower cavity block 62 does not have the cavity 621. This is effective in simplifying the resin molding die 60.

(Fourth Embodiment)

In this embodiment, the semiconductor devices 50 of the second and third embodiments are combined.

[Structure of Semiconductor Device]

Figure 10:
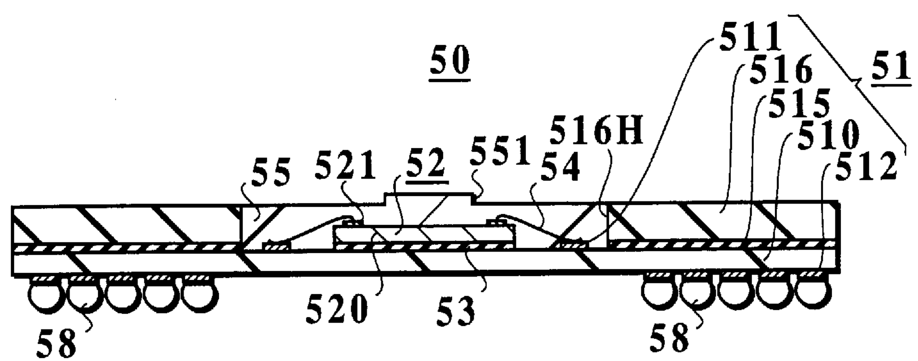
FIG. 10 is a cross section of a semiconductor device according to a fourth embodiment of the invention.

Referring to FIG. 10, the semiconductor device 50 comprises the base 51, the semiconductor element 52 on the base 51, and the resin seal 55 which encapsulates the semiconductor element 52 and the base 51, and has the protrusion 551. The semiconductor element 52 is identical to the semiconductor element 52 in the first embodiment, and will not be described in detail.

The base 51 is identical to the base 51 of the third embodiment, and is constituted at least by: the insulated substrate 510; the frame 516 which is positioned on the front surface (upper surface in FIG. 10) of the insulated substrate 510, and has the opening 516H at the center thereof in order to house the semiconductor element 52 and the resin seal 55; an adhesive layer 515 provided between the insulated substrate 510 and the frame 516; the terminal 511 provided on the front surface of the insulated substrate 510 (upper surface in FIG. 10); and the terminal 512 provided on the rear surface of the insulated substrate 510 (lower surface in FIG. 10).

The resin seal 55 has the protrusion 551 at the center thereof similarly to the resin seal 55 of the second embodiment. However, the periphery of the resin seal 55 is in contact with the inner wall of the opening 516H of the frame 516. The resin seal 55 is positioned in the opening 516H, and is designed such that the upper periphery of the resin seal 55 is flush with the upper surface of the frame 516. Therefore, the semiconductor device 50 is in the shape of a plate since the resin seal 55 is substantially flat. The protrusion 551 at the center of the resin seal 55 extends upward with respect to the upper surface of the frame 516. The resin seal 55 is molded by the direct transfer molding process and is made of the epoxy group resin, similarly to the resin seal 55 of the third embodiment.

The semiconductor device 50 of the fourth embodiment is as effective and advantageous as the semiconductor devices 50 of the second and third embodiments.

[Method of Manufacturing Semiconductor Device]

The semiconductor device 50 of this embodiment is manufactured by the direct transfer molding process as in the second embodiment. Referring to FIG. 9, the amount of the resin 55A to be injected into the cavity 621 of resin molding die 60 is slightly increased. In the fourth embodiment, when the injecting pressure reaches the predetermined value, the pusher 603 is stopped slightly before it gets into the cavity 621, thereby forming the protrusion 551. Therefore, the fourth embodiment differs from the third embodiment in this respect.

The structures of the resin molding die 60 and the semiconductor manufacturing system 70 are the same as the resin molding die 60 of the first embodiment and the semiconductor manufacturing system 70 of the first embodiment. Therefore, their descriptions will not be given here.

The semiconductor device manufacturing method of the fourth embodiment is as effective and advantageous as that in the third embodiment.

(Fifth Embodiment)

In this embodiment, the semiconductor device 50 is substantially identical to the semiconductor device 50 of the third embodiment except for the shape of the base 51.

Figure 11:
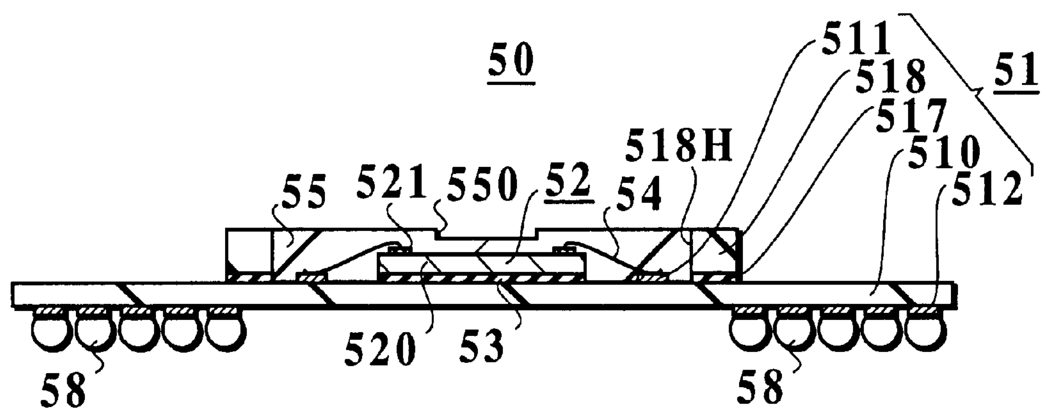
FIG. 11 is a cross section of a semiconductor device according to fifth embodiment of the invention.

Referring to FIG. 11, the semiconductor device 50 comprises the base 51, the semiconductor element 52 on the base 51, and the resin seal 55 encapsulating the semiconductor element 52 and having the recess 550. The semiconductor element 52 is identical to that of the first embodiment, and will not described here.

The base 51 is constituted at least by: the insulated substrate 510; a frame 518 which is positioned on the front surface (upper surface in FIG. 11) of the insulated substrate 510, and has an opening 518H at the center thereof in order to house the semiconductor element 52 and the resin seal 55; an adhesive layer 517 provided between the insulated substrate 510 and the frame 518; the terminal 511 provided on the front surface of the insulated substrate 510 (upper surface in FIG. 11); and the terminal 512 provided on the rear surface of the insulated substrate 510 (lower surface in FIG. 11). The frame 518 is mainly used as a dam when forming the resin 55A. When made of an elastic epoxy group resin or a rubber material, the frame 518 is coated on the insulated substrate 510. In such a case, no adhesive layer 517 will be necessary between the insulated substrate 510 and the frame 518. The terminal 511 is positioned in the opening 518H of the frame 518. Although not shown in detail, the terminals 511 and 512 are electrically connected by a through-hole wiring extending through the insulated substrate 510.

The frame 518 slightly differs from the frame 516 of the third embodiment because the frame 518 is positioned in such a manner that a part of the peripheral surface of the insulated substrate 510 is exposed. The frame 518 also functions as the dam which prevents the resin 55A filled in the cavity 621 from flowing in a horizontal direction. Alternatively, the frame 518 may be made of a metal or an alloy similarly to the frame 516 of the third or fourth embodiment. In such a case, the adhesive layer 517 is necessary, and is made of an insulating adhesive.

The resin seal 55 has the recess 550 at the center thereof similarly to the resin seal 55 of the third embodiment. The peripheral surface of the resin seal 55 is in contact with an inner wall of the opening 518H of the frame 518. The resin seal 55 is positioned in the opening 518H, and is designed such that the upper periphery of the resin seal 55 is flush with the upper surface of the frame 518. Therefore, the semiconductor device 50 is in the shape of a plate since the resin seal 55 is substantially flat. The recess 550 at the center of the resin seal 55 is set back toward the insulated substrate 510 with respect to the upper surface of the frame 518. The resin seal 55 is molded by the direct transfer molding process, and is made of the epoxy group resin, similarly to the resin seal 55 of the third embodiment.

The semiconductor device 50 of the fifth embodiment is as effective and advantageous as the semiconductor device 50 of the third embodiment.

The structures of the resin molding die 60, the semiconductor manufacturing system 70 and the semiconductor device manufacturing method are the same as those of the third embodiment, so that they will be not described here.

(Sixth Embodiment)

In this embodiment, the semiconductor device 50 is substantially identical to the semiconductor device 50 of the fourth embodiment except for the shape of the base 51.

Figure 12:
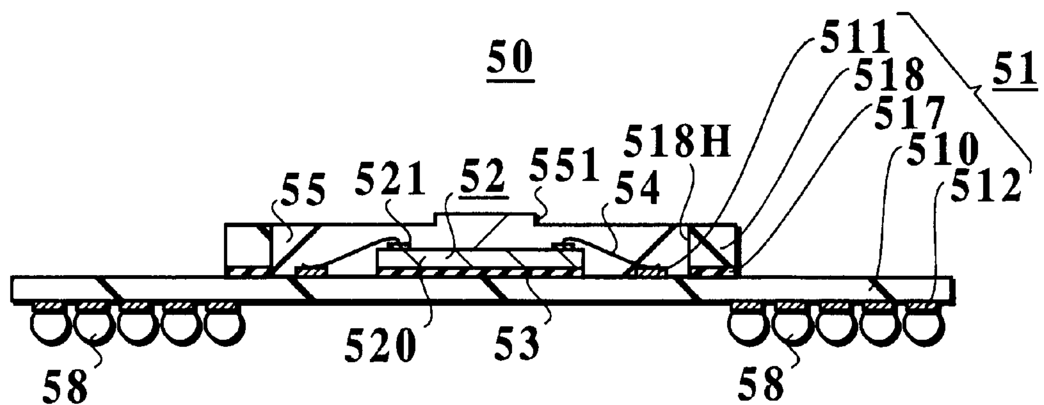
FIG. 12 is a cross section of a semiconductor device according to sixth embodiment of the invention.

Referring to FIG. 12, the semiconductor device 50 comprises the base 51, the semiconductor element 52 on the base 51, and the resin seal 55 which encapsulates the semiconductor element 52 and has the protrusion 551. The semiconductor element 52 is identical to the semiconductor element 52 of the fourth embodiment, and will not be described in detail.

The base 51 is identical to that of the semiconductor device 50 of the fifth embodiment, and is constituted at least by: the insulated substrate 510; the frame 518 which is positioned on the front surface (upper surface in FIG. 12) of the insulated substrate 510, and has the opening 518H at the center thereof in order to house the semiconductor element 52 and the resin seal 55; the adhesive layer 517 provided between the insulated substrate 510 and the frame 518; the terminal 511 provided on the front surface of the insulated substrate 510 (upper surface in FIG. 12); and the terminal 512 provided on the rear surface of the insulated substrate 510 (lower surface in FIG. 12). Although not shown in detail, the terminals 511 and 512 are electrically connected by a through-hole wiring.

The frame 518 serves at least as a dam similarly to the frame 518 of the fifth embodiment. Depending upon the material of the frame 518, no adhesive layer 517 will be necessary between the insulated substrate 51 and the frame 518 as in the fifth embodiment.

The resin seal 55 has the protrusion 551 at the center thereof similarly to the resin seal 55 of the fourth embodiment. However, the periphery of the resin seal 55 is in contact with the inner wall of the opening 518H of the frame 518. The resin seal 55 is positioned in the opening 518H, and is designed such that the upper periphery thereof is flush with the upper surface of the frame 518. The protrusion 551 at the center of the resin seal 55 is above the upper surface of the frame 518. The resin seal 55 is molded by the direct transfer molding process, and is made of the epoxy group resin, similarly to the resin seal 55 of the fourth embodiment.

The semiconductor device 50 of the sixth embodiment is as effective and advantageous as the semiconductor devices 50 of the fourth embodiment.

The structures of the resin molding die 60 and the semiconductor manufacturing system 70, and the semiconductor device manufacturing method of this embodiment are the same as those of the fourth embodiment, so that they will be not described here.

(Seventh Embodiment)

A seventh embodiment is identical to the first embodiment except for the position of the recess 550 of the resin seal 55 of the semiconductor device 50 and the position of the resin reservoir 622 of the resin molding die 60.

[Structure of Semiconductor Device]

Figure 13:
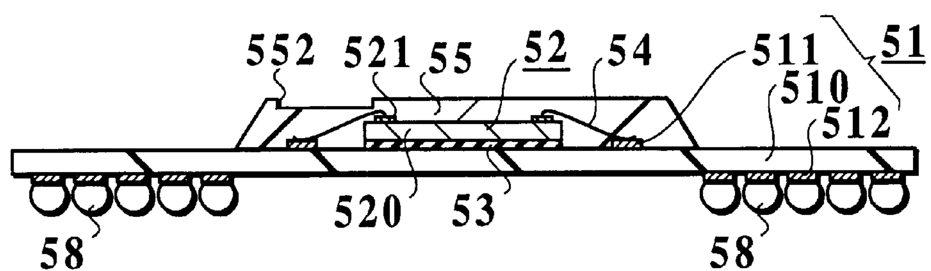
FIG. 13 is a cross section of a semiconductor device according to seventh embodiment of the invention.
Figure 14:
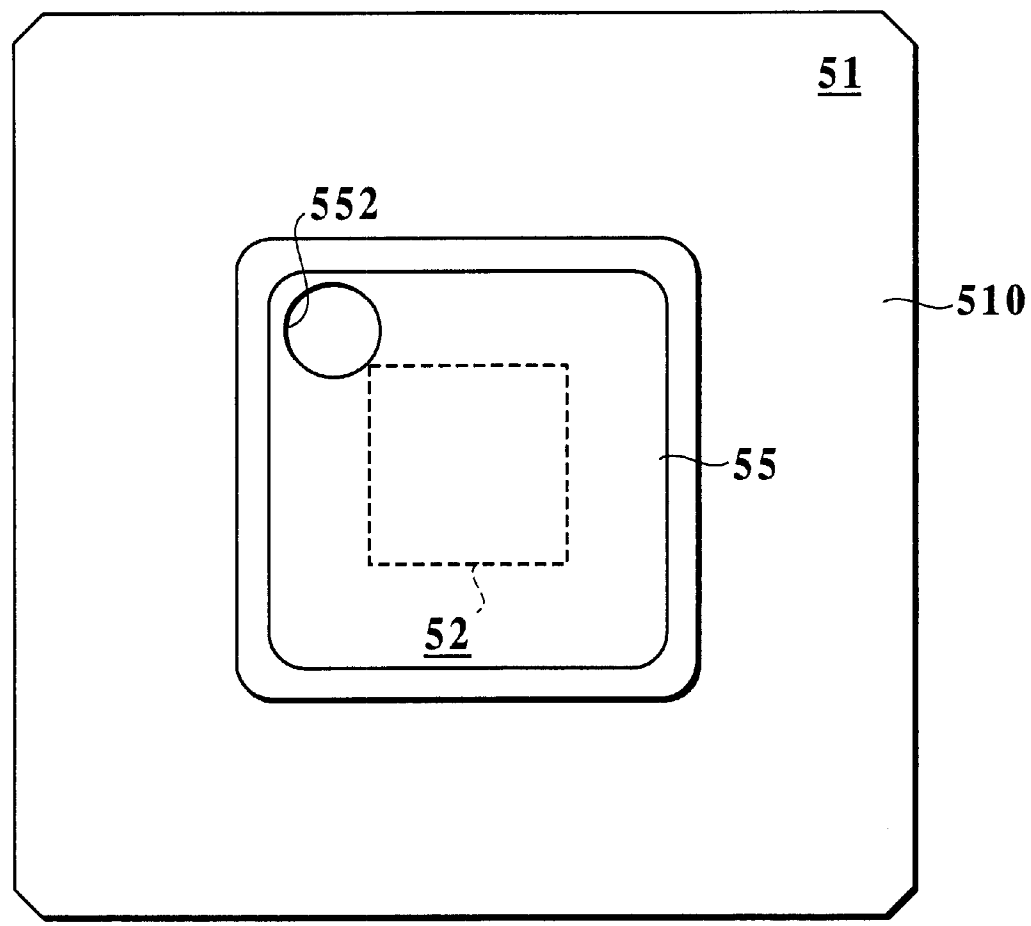
FIG. 14 is a top plan view of the semiconductor device of FIG. 13.

As shown in FIG. 13 and FIG. 14, the semiconductor device 50 comprises: the base 51; the semiconductor element 52 provided on the base 51; and the resin seal 55 encapsulating the semiconductor element 52 on the base 51 and having a recess 552. The semiconductor element 52 and the base 51 are structured similarly to those of the first embodiment, and will not described here.

The resin seal 55 has the recess 552 displaced from the center thereof, i.e. the recess 552 is present in the resin seal 55 and overlaps with the semiconductor element 52 or is completely outside the semiconductor element 52. The recess 552 functions similarly to the recess 550 of the first embodiment.

The semiconductor device 50 of this embodiment is as effective and advantageous as that of the first embodiment.

Further, this semiconductor device 50 is especially effective when wires 54 do not radially extend from the center of the resin seal 55 but when they extend in a particular direction, i.e. in a direction which is substantially in agreement with a direction in which the resin 55A is injected. For instance, referring to FIG. 14, when the wires 54 are arranged at a corner of the semiconductor elements 52 and diagonally extend thereon, the recess 552 is positioned at one corner of the resin seal 55 (e.g. at the left upper corner in FIG. 14). In this case, most of main component vector in the injecting direction of the resin 55A can be made to substantially agree with the direction in which the wires 54 extend. Therefore, the adjacent wires 54 can be protected against shorting caused by the resin 55A flowing across them. This is effective in improving the manufacturing yield of the semiconductor device 50.

[Structure of Resin Molding Die]

The resin molding die 60 is identical to that of the first embodiment except for the resin reservoir 622 displaced from the center of the cavity 621, and will not be described here.

[Structure of Semiconductor Manufacturing System]

Further, the semiconductor manufacturing system 70 is identical to that of the first embodiment, and will not be described here.

[Method of Manufacturing Semiconductor Device]

Figure 15:
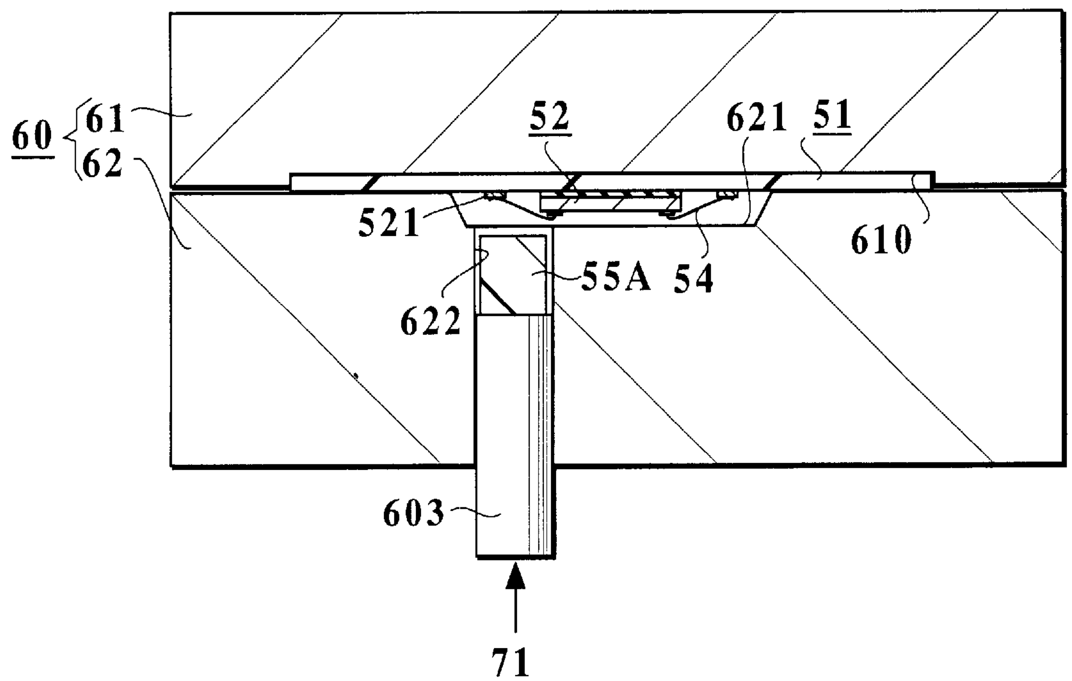
FIG. 15A and FIG. 15B are cross sections of the semiconductor device of FIG. 13 and a resin molding die, showing how the semiconductor device is manufactured.
Figure 15:
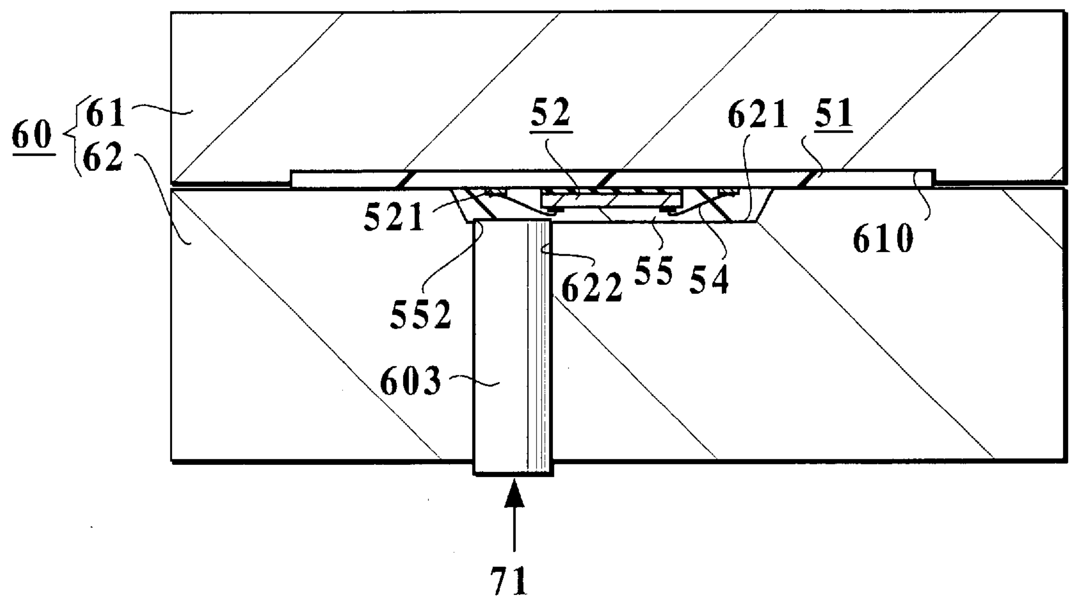

The semiconductor device 50 is manufactured by the direct transfer molding process as shown in FIG. 15A and FIG. 15B.

(1) First of all, the base 51 is placed on the lower cavity block 62 in such a manner that the semiconductor element 52 as well as a part of the base 51 is fitted in the cavity 621 of the resin molding die 60 (see FIG. 15A). In this state, the semiconductor element 52 has been mounted on the base 51, and the terminal 511 of the base 51 and the terminal 521 of the semiconductor element 52 have been electrically connected by the wires 54.

(2) The resin 55A is supplied into the resin reservoir 622 which is present above the semiconductor element 52 (see FIG. 15A) at a position displaced from the center thereof, i.e. the resin reservoir 622 is positioned near a side wall of the cavity 621.

Before or after supplying the resin 55A to the resin reservoir 622, the lower cavity block 62 is heated by a heater (not shown), and is maintained at a temperature to melt the resin 55A.

(3) The lower cavity block 62 is raised toward the upper cavity block 61 by the operation of the die driving unit 74 and the control unit 73, so that the upper and lower cavity blocks 61 and 62 are clamped as shown in FIG. 15A. Therefore, the base 51 is received in the base cavity 610 of the upper cavity block 61.

(4) Since the resin molding die 60 remains hot, the resin 55A is melted in the resin reservoir 622, and is injected into the cavity 621 via the resin reservoir 622 as shown in FIG. 15B. The pusher 603 is moved upward by the plunger driving unit 72 and the control unit 73. Specifically, the pusher 603 injects the resin 55A into the cavity 621 with an appropriate pressure and a sufficient injection stroke via the resin reservoir 622. Further, the pusher 603 slightly projects into the cavity 621 in order to form the recess 552. In this state, the resin 55A is heated, and is then hardened in order to form the resin seal 55 which encapsulates at least the semiconductor element 52 as well as a part of the base 51 and has the recess 552.

(5) Thereafter, the lower cavity block 62 is lowered by the die driving unit 74 and the control unit 73. The upper and lower cavity blocks 61 and 62 are unclamped, so that the molded semiconductor device 50 is removed from the resin molding die 60.

In this state, the semiconductor device 50 is completed by the direct transfer molding process.

The method of the seventh embodiment is as effective and advantageous as that of the first embodiment.

(Eighth Embodiment)

A semiconductor device 50 of this embodiment is identical to that of the seventh embodiment except for the shape of the resin seal 55.

[Structure of Semiconductor Device]

Figure 16:
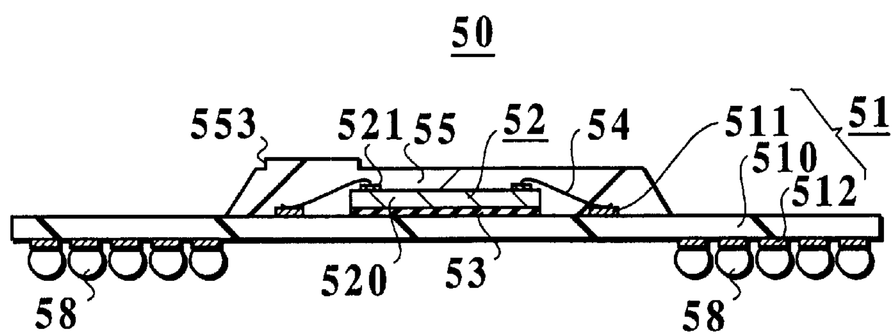
FIG. 16 is a cross section of a semiconductor device according to an eighth embodiment of the invention.

As shown in FIG. 16, the semiconductor device 50 comprises: the base 51; the semiconductor element 52 provided on the base 51; and the resin seal 55 encapsulating the semiconductor element 52 on the base 51 and having a protrusion 553. The semiconductor element 52 and the base 51 are structured similarly to those of the first embodiment, and will not described here.

The resin seal 55 has the protrusion 553 which is similar to the protrusion 551 of the second embodiment. The protrusion 553 is displaced from the center of the resin seal 55, similarly to the protrusion 552 of the seventh embodiment.

The semiconductor device 50 of this embodiment is as effective and advantageous as those of the second and seventh embodiments.

[Method of Manufacturing Semiconductor Device]

Figure 17:
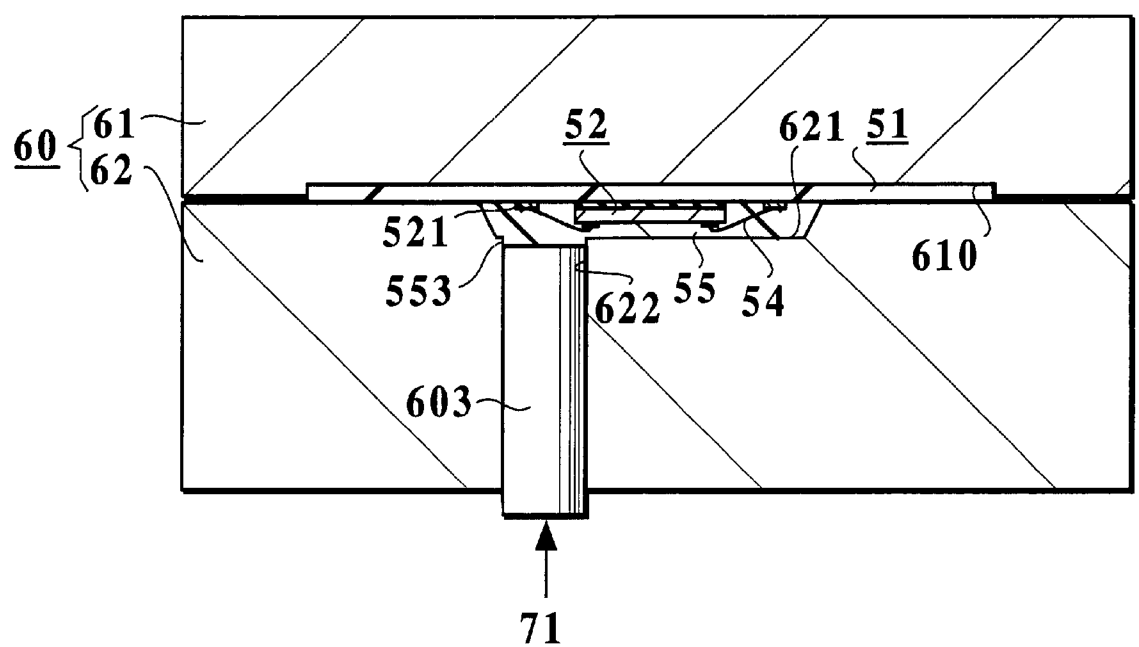
FIG. 17 is a cross section of the semiconductor device of FIG. 16 and a resin molding die, showing how the semiconductor device is manufactured.

The semiconductor device 50 is manufactured by the direct transfer molding process as shown in FIG. 17, using the resin molding die 60 and the semiconductor system manufacturing system 70 of the first embodiment, which will not be described here.

(1) The direct transfer molding process of this embodiment is identical to that of the seventh embodiment. First of all, the base 51 is placed on the lower cavity block 62 in such a manner that the semiconductor element 52 as well as a part of the base 51 is fitted in the cavity 621 of the resin molding die 60 (see FIG. 15A).

(2) The resin 55A is supplied into the resin reservoir 622 in order to substantially fill the cavity 621. The resin reservoir 662 is present above the semiconductor element 52 (see FIG. 15A) at the position displaced from the center thereof. The amount of the resin 55A to be filled in the cavity 621 is somewhat increased in order to form the protrusion 553. The lower cavity block 62 is heated to a certain temperature in order to melt the resin 55A.

(3) The upper and lower cavity blocks 61 and 62 are clamped as shown in FIG. 15A, and the melted resin 55A is injected into the cavity 621 by the pusher 603 via the resin reservoir 622. Specifically, the pusher 603 applies an appropriate pressure to the resin 55A and injects it into the cavity 621 with a sufficient stroke. The amount of the resin 55A is somewhat increased. The pusher 603 is stopped slightly before it gests into the cavity 621, thereby forming the protrusion 553. In this state, the resin 55A is heated, and is then hardened in order to form the resin seal 55 which encapsulates at least the semiconductor element 52 as well as a part of the base 51 and has the recess 553 (see FIG. 17).

(4) Thereafter, the upper and lower cavity blocks 61 and 62 are unclamped, so that the semiconductor device 50 with the resin seal 55 is removed from the resin molding die 60.

In this state, the semiconductor device 50 is completed by the direct transfer molding process.

The method of the eighth embodiment is as effective and advantageous as that of the second and seventh embodiment.

(Ninth Embodiment)

This embodiment relates to a modified structure of the base 51 and modified mounting of the semiconductor element 52 of the seventh embodiment.

[Structure of Semiconductor Device]

Figure 18:
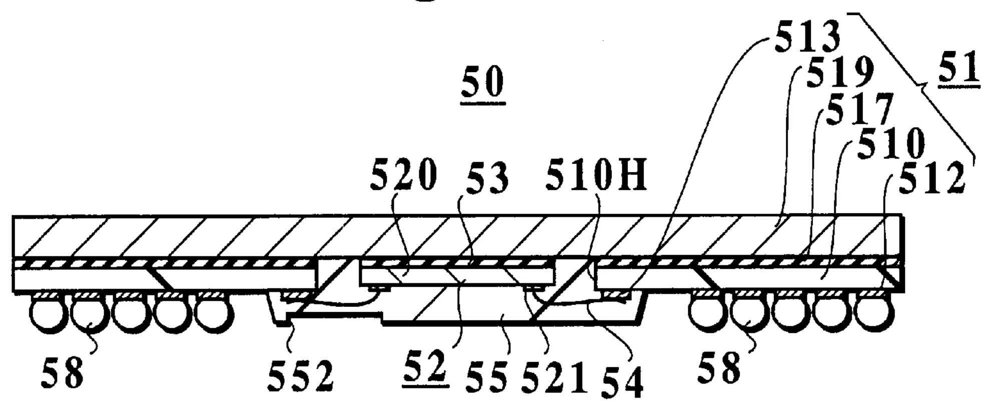
FIG. 18 is a cross section of a semiconductor device according to a ninth embodiment of the invention.
Figure 19:
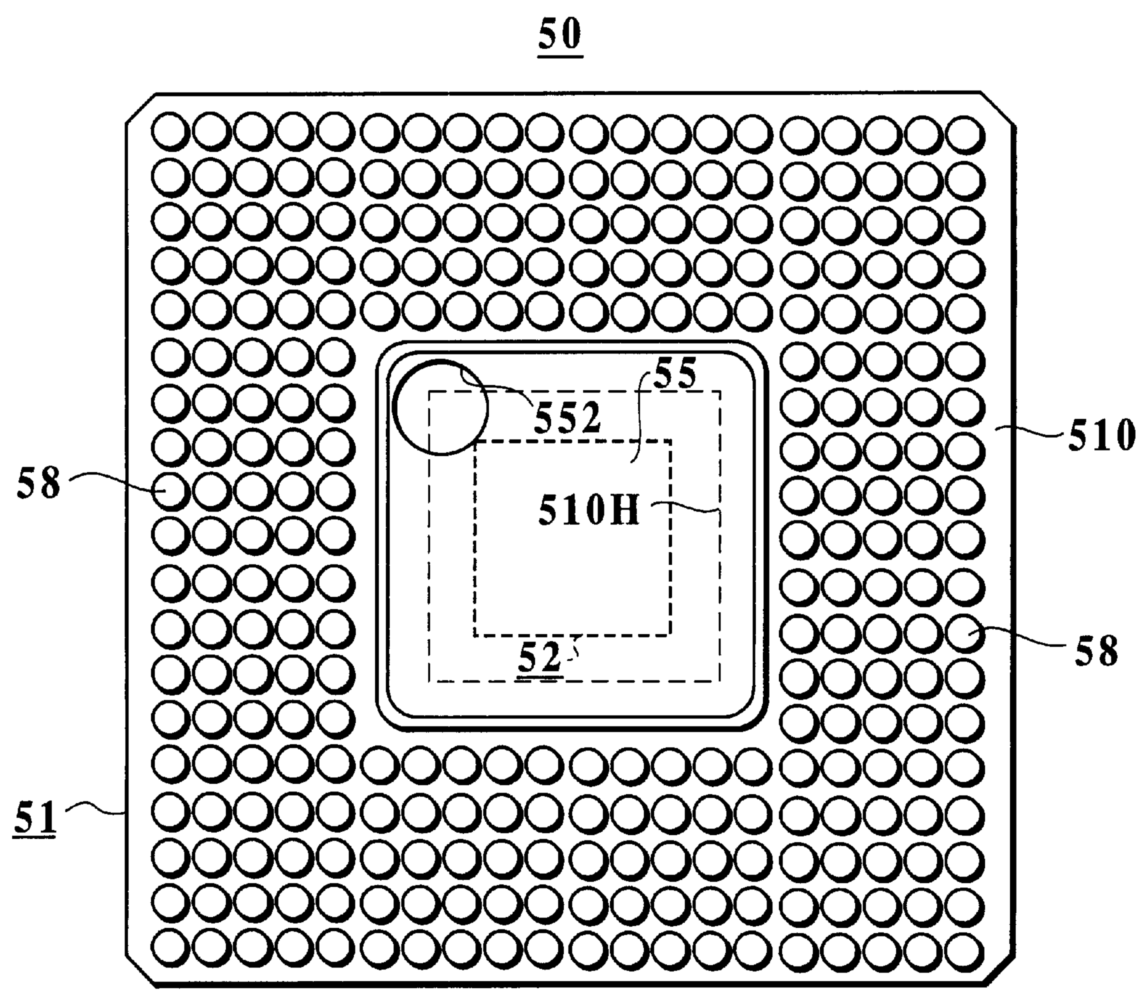
FIG. 19 is a top plan view of the semiconductor device of FIG. 18.

As shown in FIG. 18 and FIG. 19, the semiconductor device 50 is identical to that of the seventh embodiment, and comprises: the base 51; the semiconductor element 52 provided on the base 51; and the resin seal 55 encapsulating the semiconductor element 52 on the base 51 and having the recess 552 above the semiconductor element 52. The semiconductor element 52 and the base 51 are structured similarly to those of the first embodiment, and will not be described here.

The base 51 is constituted at least by: the insulated substrate 510 which has the opening 510H at the center thereof in order to house the semiconductor element 52 and the resin seal 55; a radiating plate 519 extending all over the front surface of the insulated substrate 510 (on the upper surface in FIG. 18); an adhesive layer 517 sandwiched by the insulated substrate 510 and the radiating plate 519; a terminal 513 provided on the center front surface (upper surface in FIG. 18) of the insulated substrate 510, and the terminal 512 provided on the rear peripheral surface (lower surface in FIG. 18) of the insulated substrate 510. The terminal 513 is arranged around the opening 510H, and is electrically connected to the terminal 512 by a wiring (not shown).

The semiconductor element 52 is mounted in the opening 510H on the rear surface of the radiating plate 519 via the adhesive layer 53. Different from the semiconductor devices 50 of the first to eighth embodiments, the semiconductor element 52 is mounted with its main surface (where the circuits are mounted) facing with a device mounting surface (lower surface in FIG. 18). The radiating plate 519 efficiently radiates heat generated by the operation of the circuits mounted on the semiconductor element 52. In this embodiment, the radiating plate 519 may be a copper (Cu) plate having a nickel (Ni)-plated layer with excellent heat conductivity.

The insulated substrate 510 with the opening 510H has the semiconductor element 52 mounted therein, and functions at least as a dam similarly to the frame 516 of the semiconductor device 50 in the third embodiment.

The adhesive layer 517 may be made of an insulated resin adhesive.

The resin seal 55 has the recess 552 displaced from the center thereof as in the seventh embodiment. Further, the resin seal 55 is via its periphery in contact with the inner wall of the opening 510H of the base 51, i.e. the resin seal 55 is positioned in the opening 510H. The resin seal 55 is made by the direct transfer molding process similarly to the resin seal 55 of the third embodiment, and is made of an epoxy group resin, for example.

Alternatively, the resin seal 55 of the semiconductor device 50 may have the recess 550 at the center thereof as in the first embodiment.

The semiconductor device 50 of this embodiment is as effective and advantageous as that of the third embodiment and seventh embodiment.

[Method of Manufacturing Semiconductor Device]

Figure 20:
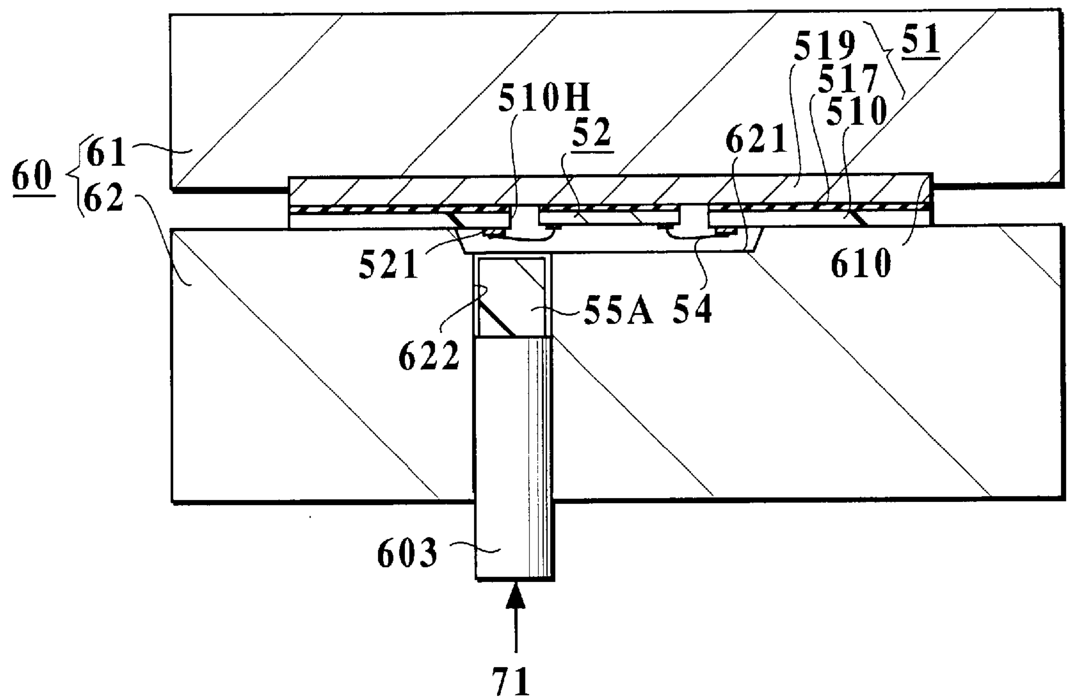
FIG. 20A and FIG. 20B are cross sections of the semiconductor device of FIG. 18 and a resin molding die, showing how the semiconductor device is manufactured.
Figure 20:
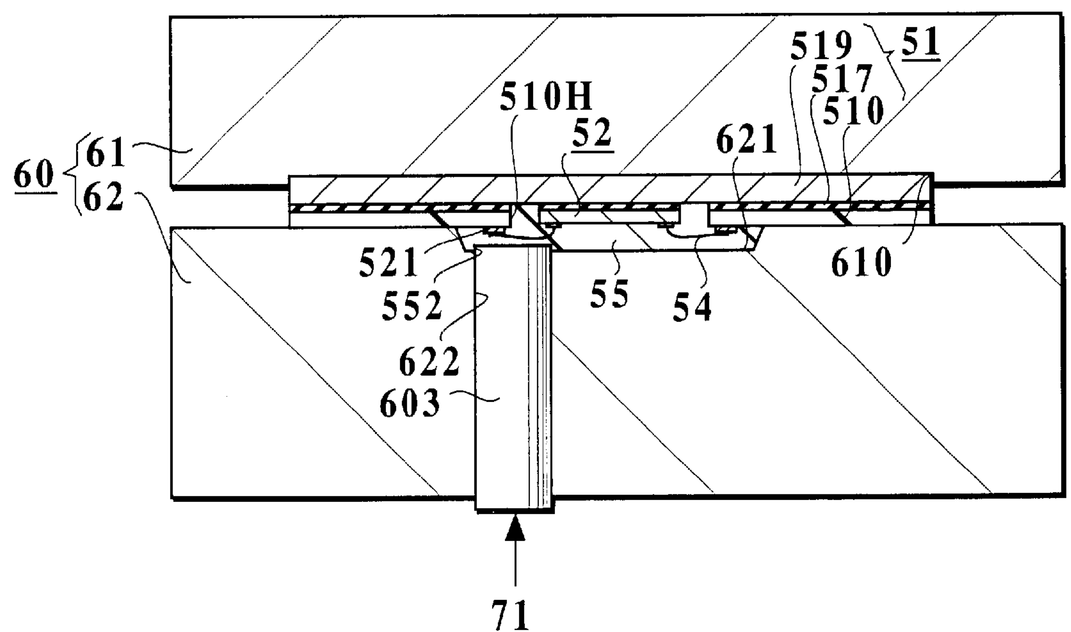

The semiconductor device 50 is manufactured by the direct transfer molding process as shown in FIG. 20A and FIG. 20B, using the resin molding die 60 and the semiconductor manufacturing system 70, which are substantially identical to those used in the first embodiment, and will not be described here.

(1) The direct transfer molding process of this embodiment is identical to that of the first embodiment. First of all, the base 51 is placed on the lower cavity block 62 in such a manner that the semiconductor element 52 as well as a part of the base 51 is fitted in the cavity 621 of the resin molding die 60 (see FIG. 20A). In this embodiment, the insulated substrate 510 of the base 51 has the opening 510H and the radiating plate 519, so that the cavity 621 is defined by the rear center of the insulated substrate 510, a peripheral wall of the opening 510H, the rear center of the radiating plate 519, and the upper surface of the lower cavity block 62 of the resin molding die 60.

(2) The resin 55A is supplied to the resin reservoir 622, which is above a position displaced from the center of the semiconductor element 52 (see FIG. 20A). The resin 55A is then injected into the cavity 621 in order to fill it substantially. The amount of the resin 55A is somewhat reduced taking the recess 552 into consideration. Further, the lower cavity block 62 is maintained at a certain temperature to melt the resin 55A.

(3) The upper and lower cavity blocks 61 and 62 are clamped as shown in FIG. 20A. The melted resin 55A is injected into the cavity 621 via the resin reservoir 622 as shown in FIG. 20B. Specifically, the pusher 603 injects the resin 55A into the cavity 621 with an appropriate pressure and a sufficient injection stroke via the resin reservoir 622. Further, the pusher 603 slightly projects into the cavity 621 in order to form the recess 552. In this state, the resin 55A is hardened in order to form the resin seal 55 which encapsulates at least the semiconductor element 52 as well as a part of the base 51 and has the recess 552. (See FIG. 20B.)

(4) Thereafter, the upper and lower cavity blocks 61 and 62 are unclamped in order to remove the semiconductor device 50 having the resin seal 55, from the resin molding die 60.

In this state, the semiconductor device 50 is completed by the direct transfer molding process.

The method of the ninth embodiment is as effective and advantageous as that of the first and seventh embodiment.

(Tenth Embodiment)

In this embodiment, a semiconductor device 50 is a combination of the semiconductor devices 50 of the eighth and ninth embodiments.

[Structure of Semiconductor Device]

Figure 21:
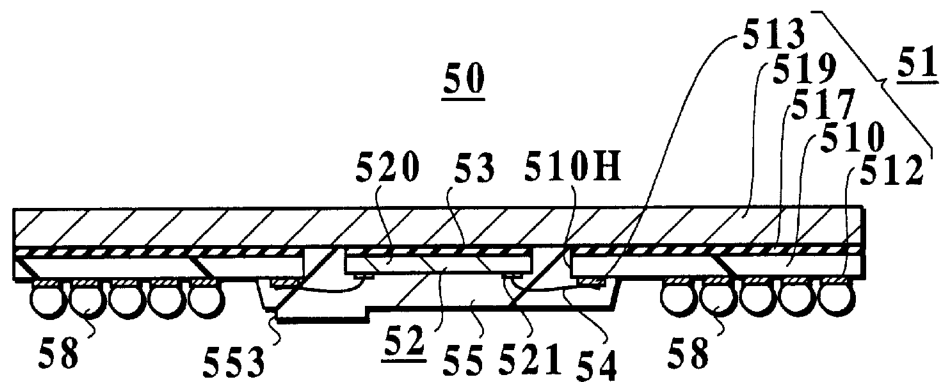
FIG. 21 is a cross section of a semiconductor device according to a tenth embodiment of the invention.
Figure 22:
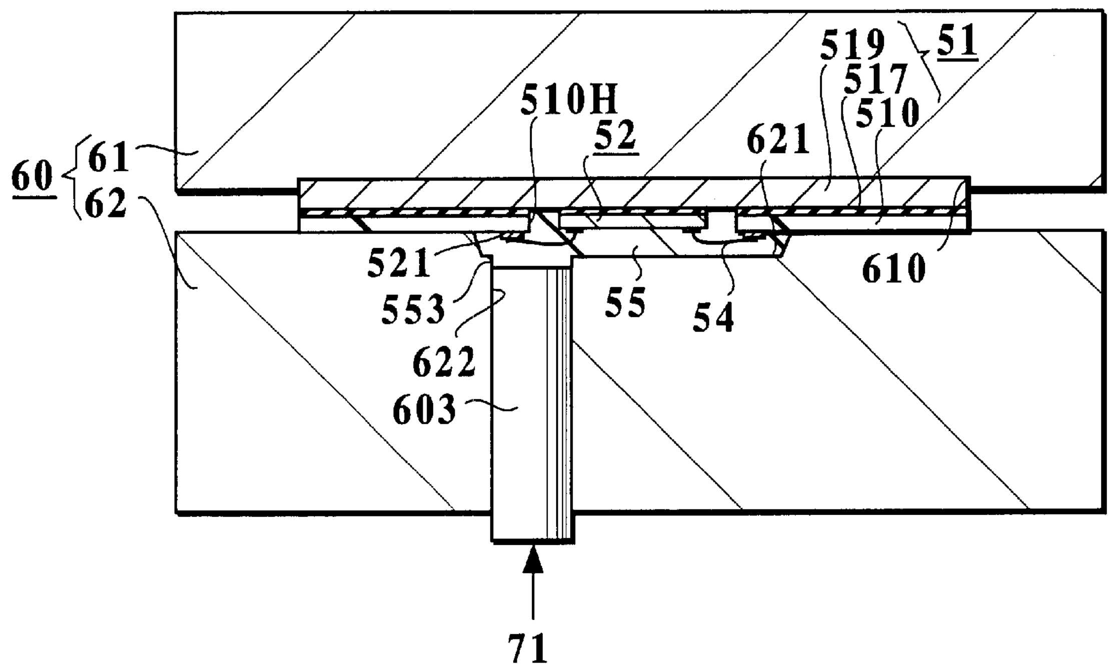
FIG. 22 is a cross section the semiconductor device of FIG. 21 and a resin molding die, showing how the semiconductor device is manufactured.

Referring to FIG. 21, the semiconductor device 50 comprises the base 51, the semiconductor element 52 mounted on the base 51 similarly to that of the ninth embodiment, and further includes the resin seal 55 having the protrusion 553 above the semiconductor element 52, similarly to that of the eighth embodiment. Therefore, the base 51 and semiconductor element 52 will not be described in detail here.

Alternatively, the resin seal 55 may be formed just above the center of the semiconductor element 52 and has the recess 551 as that in the second embodiment.

[Method of Manufacturing Semiconductor Device]

The direct transfer mold process for manufacturing the semiconductor device 50 of this embodiment is substantially identical to that of the ninth embodiment except for the following: as shown in FIG. 20B, the pusher 603 of the resin molding die 60 is stopped slightly before it gets into the cavity 621, in order to form the protrusion 553.

The resin molding die 60 and the semiconductor manufacturing system 70 of the first embodiment are also applied to the tenth embodiment, and will not be described here.

The semiconductor device 50 of the tenth embodiment is as effective and advantageous as that of the eight and ninth embodiment.

In this embodiment, the protrusion 553 (or the protrusion 551) of the resin seal 55 is also usable as a radiating path, which is effective in improving the radiating performance. Further, the protrusion 553 can form a gap between the resin seal 55 and a mounting board (on which the semiconductor device 50 is mounted) or equipment in which the semiconductor device 50 is incorporated. Such a gap is effective in promoting flow of a cleaning agent or air during the cleaning or drying process after the semiconductor device 50 has been mounted. Therefore, it is possible to improve the manufacturing yield, reduce erroneous mounting, and assure the reliability of the semiconductor device 50.

(Eleventh Embodiment)

This embodiment relates to a modified structure of the resin molding die 60 used in the first to tenth embodiments.

[Structure of Resin Molding Die]

Figure 23:
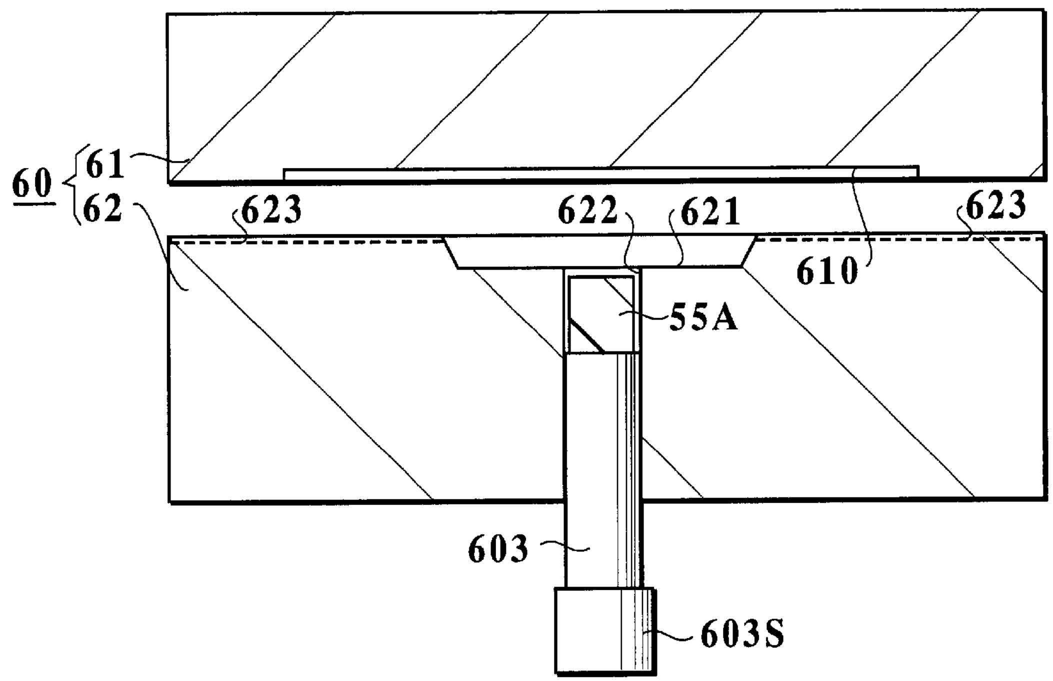
FIG. 23 is a cross section of a resin molding die in an eleventh embodiment of the invention.

As shown in FIG. 23, the resin molding die 60 is substantially identical to that of the first embodiment, and comprises at least: the upper and lower cavity blocks 61 and 62; the cavity 621 on the lower cavity block 62; the resin reservoir 622 in direct contact with to the cavity 621 and housing the resin 55A to be injected into the cavity 621 in order to fill it substantially; the pusher 603 for injecting the resin 55A into the cavity 621; and an air vent 623 for discharging air from the cavity 621.

The air vent 623 is present on the upper surface of the lower cavity block 62, and discharges air from the cavity 621 to sides of the lower cavity block 62. Alternatively, the air vent 623 may be provided on the upper cavity block 61. Further, the air vent 623 may be provided on the flat upper surface of the lower cavity block 62 of the resin molding die 60 of the third embodiment.

In this embodiment, a stop 603S is provided at the bottom (at the lower side in FIG. 23) of the pusher 603 in order to control the injection stroke thereof. The stop 603S is thicker than the pusher 603 and the resin reservoir 622. When reaching the bottom of the lower cavity block 62, the stop 603S prevents the pusher 603 from sliding upward to the cavity 621.

Therefore, it is possible to mechanically control the injection stroke of the pusher 603 by the stop 603S, i.e. the pusher 603 is prevented from getting into the cavity 621 more than necessary, coming into contact with the semiconductor element 52 or the upper cavity block 61, and damaging or breaking the resin molding die 60. This is effective in improving the manufacturing yield of the semiconductor device 50, and further improving the rate of operation of the semiconductor manufacturing system since it can operate without problems caused by the mal-operation of the resin molding die 60.

(Twelfth Embodiment)

In this embodiment, a resin molding die 60 of the eleventh embodiment is provided with a plurality of resin reservoirs.

[Structure of Resin Molding Die]

Figure 24:
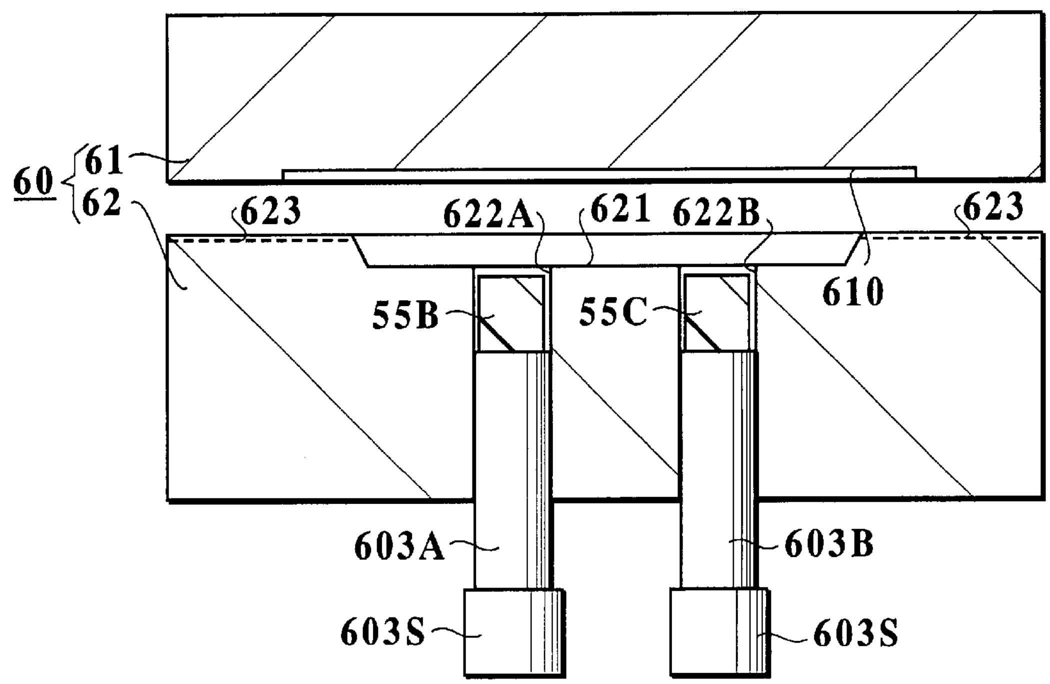
FIG. 24 is a cross section of a resin molding die in a twelfth embodiment of the invention.
Figure 25:
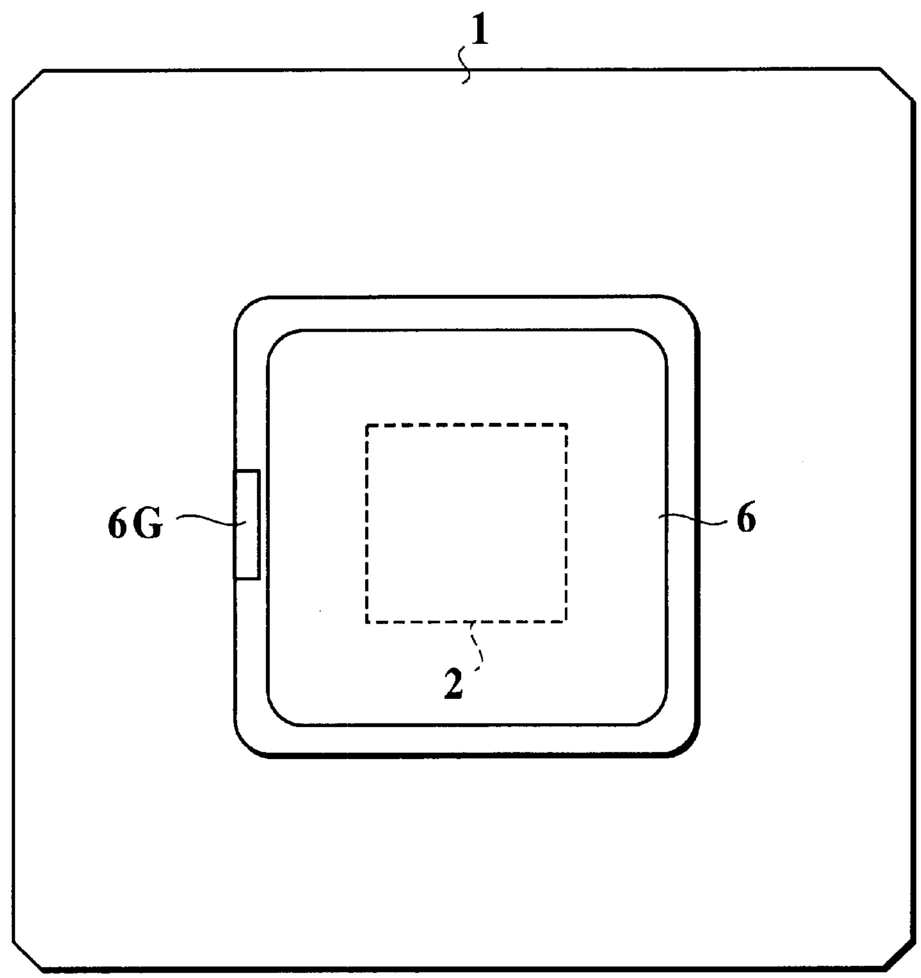
FIG. 25 is a top plan view of a semiconductor device in the related art.
Figure 26:
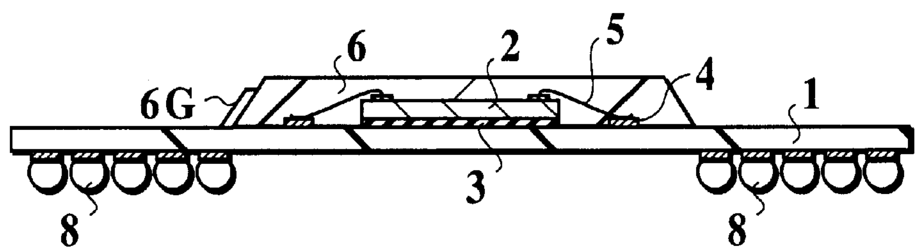
FIG. 26 is a cross section of the semiconductor device of FIG. 25.
Figure 27:
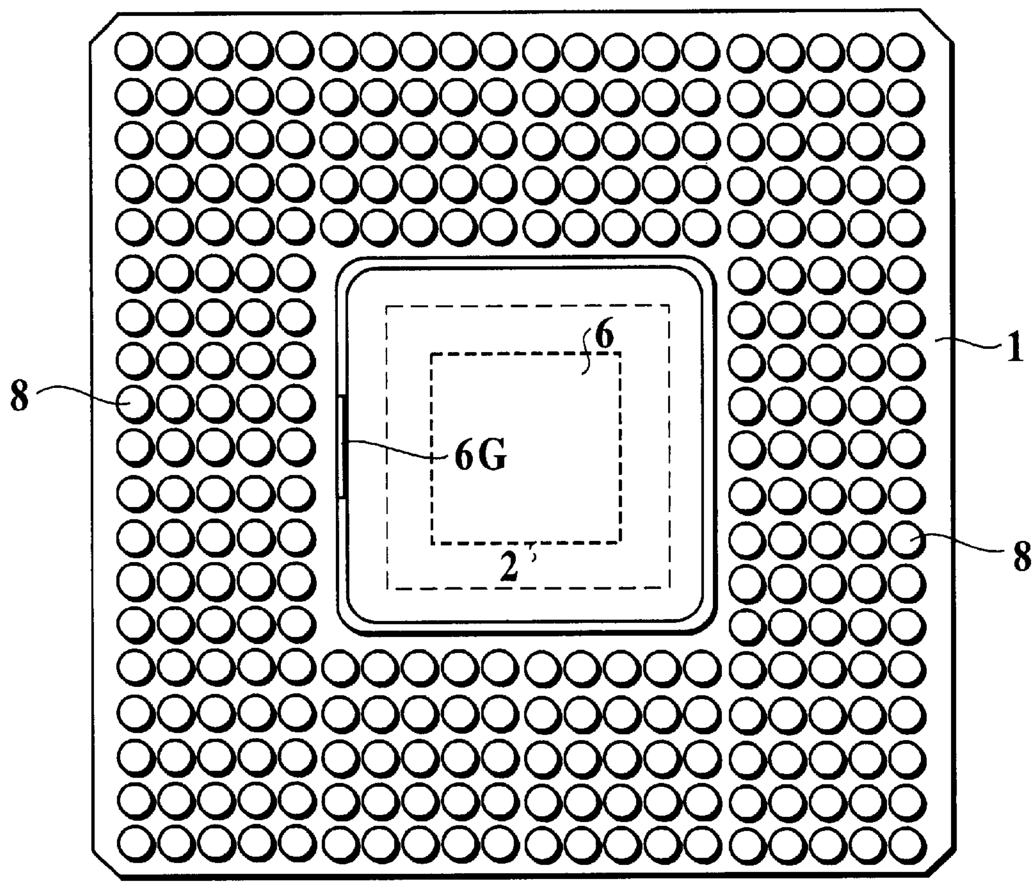
FIG. 27 is a top plan view of another semiconductor device in the related art.
Figure 28:
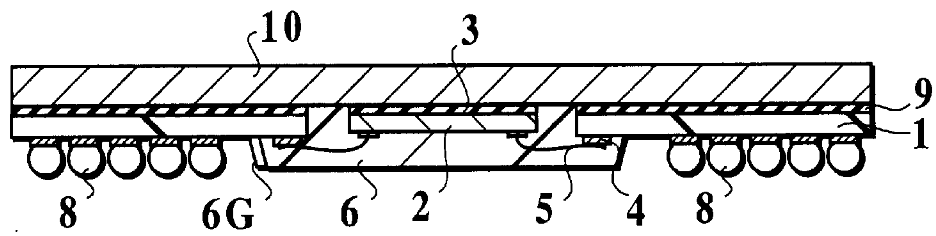
FIG. 28 is a cross section of the semiconductor device of FIG. 27.
Figure 29:
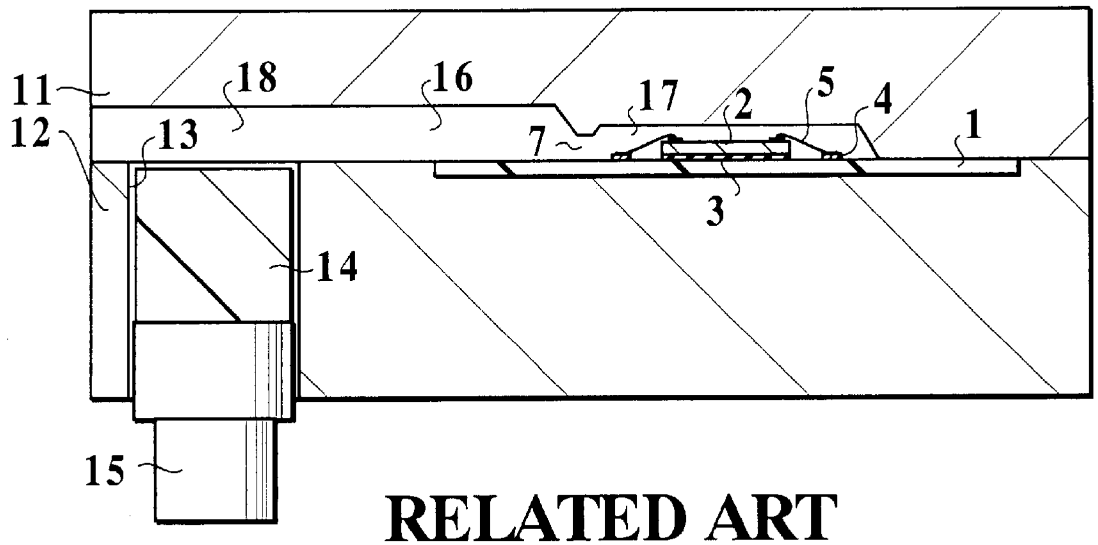
FIG. 29A and FIG. 29B are cross sections showing how mold encapsulation is performed for the semiconductor device of FIG. 25 and a resin molding die.
Figure 29:
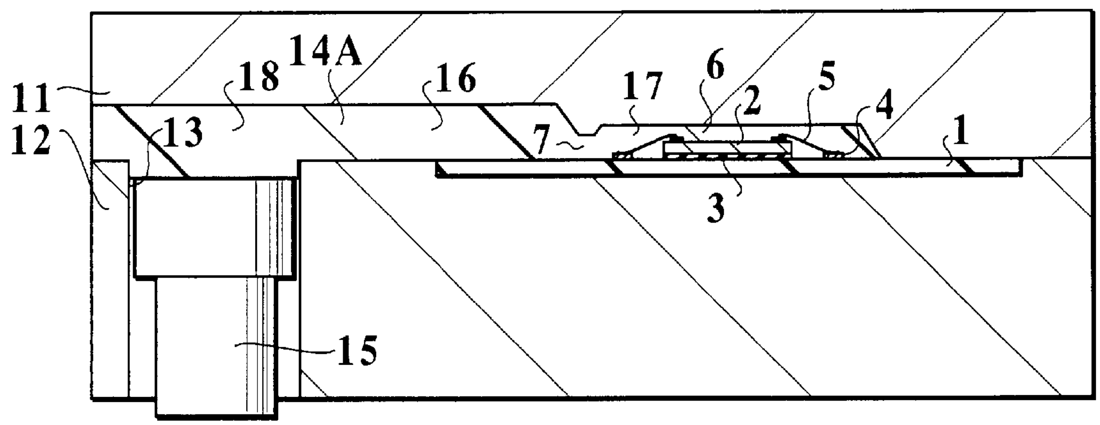
Figure 30:
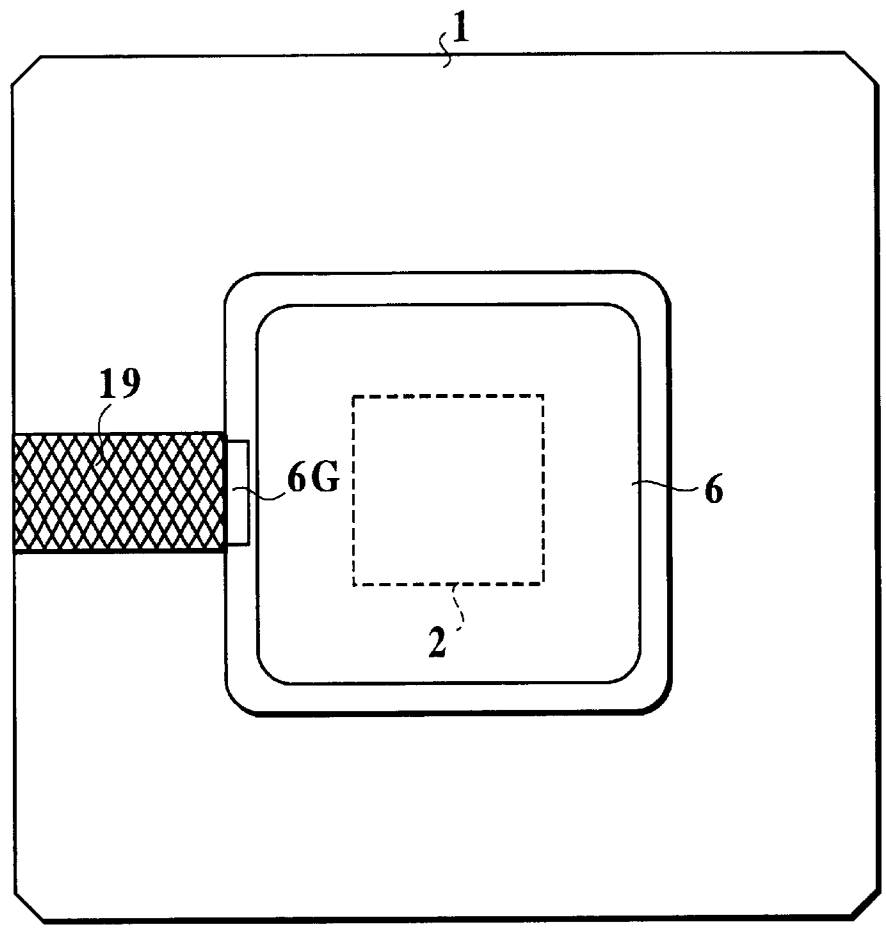
FIG. 30 is a top plan view of a semiconductor device of the related art.

Referring to FIG. 24, the resin molding die 60 comprises at least: the upper cavity block 61; the lower cavity block 62 having the cavity 621; a plurality of resin reservoirs 622A and 622B in direct contact with the cavity 621 and used for housing resins 55B and 55C; and pushers 603A and 603B injecting the resins 55B and 55C into the cavity 621 via the resin reservoirs 622A and 622B, respectively. Further, the air vent 623 is provided in order to discharge air from the cavity 621.

The resin reservoirs 622A and 622B are positioned in order to uniformly inject the resins 55B and 55C into the cavity 621. Specifically, the former is positioned at the left center of the cavity 621 while the latter is positioned at the right center of the cavity 621 so that they uniformly inject the resins 55B and 55C to the left and right halves of the cavity 621, respectively.

The pushers 603A and 603B are provided with stops 603S, respectively, as in the resin molding die 60 of the eleventh embodiment.

The resin molding die 60 of this embodiment is as effective and advantageous as that of the eleventh embodiment.

Further, the resin molding die 60 of this embodiment is preferable to a semiconductor device 50 having a large resin seal 55, e.g. to a resin seal of a multi-chip module type semiconductor device in which a plurality of semiconductor elements 52 are mounted on the base 51.

(Other Embodiments)

The embodiments of the invention has been described with reference to the semiconductor devices 50 which include the semiconductor elements 52 mounted on the bases 51 having at least the insulated substrate 510, the resin molding dies 60 and semiconductor manufacturing systems 70 for molding the resin seals 55 for the semiconductor devices 50, and the semiconductor device manufacturing methods.

Further, the embodiment of the invention is applicable to a semiconductor device 50 in which a semiconductor element 52 is mounted on a base 51 made of a lead frame, a resin molding die 60 and a semiconductor manufacturing system 70 for molding a resin seal 55 for such a semiconductor device 50, and a method of manufacturing the semiconductor device 50.

Further, the embodiment of the invention is applicable to a semiconductor device 50 which includes a plurality of recesses 550 or 552 or a plurality of protrusions 551 and 553.

The resin molding die 60 having the two resin reservoirs 622A and 622B of the twelfth embodiment may include three or more resin reservoirs, in the embodiment of the invention.

According to the embodiment of the invention it is possible to provide the methods of manufacturing the semiconductor devices which are free from resin waste generated during the formation of the resin seals, and are less expensive.

Further, it is possible to provide methods of manufacturing the reliable semiconductor devices which are protected against the peeling of the resin seals and shorting of wires, and improve manufacturing yield.

The embodiment of the invention can provide the methods of manufacturing the semiconductor devices by which the resin seals can be reliably formed without cracking of the substrates or leakage of the resins even if the substrates have various degrees of thickness. That is to say, the resin encapsulation is possible using the direct transfer mold process regardless of the thickness of the substrate (e.g. the ceramics substrate), because the resin is directly made in the necessary position. In short, the resin does not leakage, because the clearance of between the resin molding die and the substrate does not occur, when the substrate is thin, because the resin molding die does not contain the cull, the runner and the resin gate. When the substrate is thick, it is usual that the resin molding die is clamped and the substrate is deformed in order to obviate a gap around a cull or runner and to prevent the resin from leaking. In such a case, a substrate made of ceramics having a high elasticity is easily cracked and damaged. However, in the embodiment of the present invention, since there is no cull or runner, it is not necessary to clamp the resin molding die by applying a load which may deform the substrate. Therefore, the substrate is not cracked.

It is possible to provide the resin molding dies which are effective in carrying out the foregoing semiconductor device manufacturing methods.

The embodiment of the invention can provide the semiconductor manufacturing systems which can realize the foregoing semiconductor manufacturing methods.

In accordance with the embodiment of the invention, it is possible to downsize the semiconductor devices.

It is possible to provide the reliable semiconductor devices which can reduce mounting errors.

Finally, it is possible to provide the reliable semiconductor devices which can assure excellent radiating performance.

The invention has been described in detail with particular reference to preferred embodiments, but it will be understood that variations and modifications can be effected within the spirit and scope of the invention as set forth in the claims.

What is claimed is:

1. A method of manufacturing a semiconductor device comprising:

arranging at least one semiconductor element in a cavity of a resin molding die;

supplying a resin to a resin reservoir in direct contact with the cavity in order to substantially fill the cavity; and injecting the resin into the cavity only from the resin reservoir and forming a resin seal for encapsulating the semiconductor element, wherein a recess is simultaneously formed at a part of the resin seal between the cavity and the resin reservoir.

2. The method of claim 1, wherein supplying a resin to a resin reservoir in direct contact with the cavity in order to substantially fill the cavity comprises placing the resin reservoir in contact with the cavity without via a cull and a runner.

3. The method of claim 1, wherein supplying a resin to a resin reservoir in direct contact with the cavity in order to substantially fill the cavity comprises determining a volume of the resin to be substantially equal to a volume of the cavity with a volume of the semiconductor element deducted.

4. The method of claim 1, wherein supplying a resin to a resin reservoir in direct contact with the cavity in order to substantially fill the cavity comprises determining a volume of the resin to be slightly smaller than a volume of the cavity with a volume of the semiconductor element deducted.

5. The method of claim 1, wherein the recess promotes heat radiation from the semiconductor element.

6. A method of manufacturing a semiconductor device comprising:

arranging at least a base and a semiconductor element on the base in a cavity of a resin molding die;

supplying a resin to a resin reservoir in direct contact with the cavity and above the semiconductor element in order to substantially fill the cavity; and injecting the resin into the cavity only from the resin reservoir and forming a resin seal for encapsulating at least a part of the base and the semiconductor element, wherein a recess is simultaneously formed at a part of the resin seal between the cavity and the resin reservoir.

7. The method of claim 6, wherein arranging at least a base and a semiconductor element on the base in a cavity of a resin molding die comprises using the base constituted by at least a circuit board, a printed circuit board, a wiring board an insulated substrate, a tape substrate, a resin substrate, a ceramics substrate, a power source substrate, a radiating substrate or a lead.

8. The method of claim 6, where supplying a resin to a resin reservoir in direct contact with the cavity and just above the semiconductor element in order to substantially fill the cavity comprises placing the resin reservoir in direct contact with the cavity at a position above a circuit mounting surface of the semiconductor element.

9. A resin molding die comprising:

a cavity;

a resin reservoir in direct contact with the cavity and housing a resin for substantially filling the cavity; and a pusher injecting the resin into the cavity only from the resin reservoir, and forming a resin seal for encapsulating the semiconductor element, wherein a recess is simultaneously formed at a part of the resin seal between the cavity and the resin reservoir.

10. The resin molding die of claim 9, further comprising an upper cavity block and a lower cavity block, wherein the cavity is present between the upper and lower cavity blocks.

11. The resin molding die of claim 10, wherein the cavity is present on either the upper or lower cavity block.

12. The resin molding die of claim 10, wherein either the upper or lower cavity block is flat at a surface thereof facing with either the lower or upper cavity block.

13. The resin molding die of claim 9, wherein the resin reservoir is formed at the center of the cavity facing with an upper surface a semiconductor element put in the cavity.

14. The resin molding die of claim 9, wherein the resin reservoir is formed at a position displaced from the center of the cavity facing with an upper surface a semiconductor element put in the cavity.

15. The resin molding die of claim 9, wherein the pusher includes a stop for controlling a resin injection stroke.

16. The resin molding die of claim 9, wherein the pusher has a curved end opposite to the end thereof near the cavity.

17. A semiconductor manufacturing system comprising:

a resin molding die which includes a cavity, a resin reservoir in direct contact with the cavity and housing a resin for substantially filling the cavity, and a pusher injecting the resin into the cavity only from the resin reservoir and forming a resin seal for encapsulating the semiconductor element, wherein a recess is simultaneously formed at a part of the resin seal between the cavity and the resin reservoir;

a plunger for driving the pusher of the resin molding die;

a plunger driving unit for driving the plunger; and a control unit for driving the plunger driving unit.

18. The semiconductor manufacturing system of claim 17 further comprising a die driving unit for clamping and unclamping the resin molding die.

19. The semiconductor manufacturing system of claim 17, wherein the plunger is provided with a stop for controlling a resin injection stroke of the pusher.

20. The semiconductor manufacturing system of claim 17, wherein the pusher is in contact with the plunger via a curved end thereof.

21. The semiconductor manufacturing system of claim 17, wherein the resin reservoir of the resin molding die is formed at the center of the cavity facing with an upper surface a semiconductor element put in the cavity.

22. The semiconductor manufacturing system of claim 17, wherein the resin reservoir of the resin molding die is formed at a position displaced from the center of the cavity facing with an upper surface a semiconductor element put in the cavity.

* * * * *

UNITED STATES PATENT AND TRADEMARK OFFICE

CERTIFICATE OF CORRECTION

PATENT NO. : 6,498,055 B2
DATED : December 24, 2002
INVENTOR(S) : Fukuda et al.

It is certified that error appears in the above-identified patent and that said Letters Patent is hereby corrected as shown below:

Column 24,
Line 64, change “wiring board” to -- wiring board, --.

Signed and Sealed this

Eleventh Day of March, 2003

JAMES E. ROGAN
*Director of the United States Patent and Trademark Office*